United States Patent [19]

Takahashi et al.

[11] Patent Number: 5,368,193

[45] Date of Patent: Nov. 29, 1994

[54] ELECTRONIC COMPONENT PACKAGING MEANS, AND SUPPLY MECHANISM FOR AND METHOD OF SUPPLYING ELECTRONIC COMPONENTS BY USING THE ELECTRONIC COMPONENT PACKAGING MEANS

[75] Inventors: Tetsuo Takahashi; Shinichi Araya; Kuniaki Takahashi; Kunio Mogi; Koji Kudo; Takeshi Ito; Hiroshi Ikeda, all of Tokyo, Japan

[73] Assignee: TDK Corporation, Tokyo, Japan

[21] Appl. No.: 993,734

[22] Filed: Dec. 17, 1992

[30] Foreign Application Priority Data

Dec. 18, 1991 [JP] Japan .............................. 3-110793[U]
Apr. 20, 1992 [JP] Japan .............................. 4-126812[U]

[51] Int. Cl.$^5$ ............................................. B65G 59/00
[52] U.S. Cl. .................................... 221/278; 221/287; 29/759
[58] Field of Search ............... 221/278, 287, 197, 224, 221/236, 289; 29/740, 759

[56] References Cited

U.S. PATENT DOCUMENTS

| | | | |
|---|---|---|---|
| 4,578,001 | 3/1986 | Ochs et al. | 221/278 |
| 4,627,156 | 12/1986 | Vancelette | 221/278 |
| 4,801,044 | 1/1989 | Kubota et al. | 221/278 |

*Primary Examiner*—Kenneth W. Noland
*Attorney, Agent, or Firm*—Dann, Dorfman, Herrell and Skillman

[57] ABSTRACT

Electronic component packaging case comprising a substantially plate-like body having a substantially spiral passageway formed in its interior, a linear passageway formed therein as a continuation of an outermost circular portion of the sapiral passageway, an outlet formed therein as a continuation of the linear passageway to communicate with the exterior of the body, a plurality of electronic components received in a row in the spiral passageway, and a plurality of air-intakes for facilitating forwarding of the electronic components along the spiral passageway to the outlet, the air-intakes being formed in the casing body in a manner to communicate between respective circular portions of the spiral passageway and the exterior of the casing body, the case being adapted to be supported on a base of an electronic component supply mechanism with the body standing on the base when the case is used as an electronic component supply source, the outlet being formed at a portion of the casing body which is located at an upper position when the case is supported on the base, the outlet being faced upward, above which outlet the mounting head is adapted to wait. Also, an electronic component supply mechanism for and a method of supplying electronic components to the mounting head by using the packaging case are disclosed.

64 Claims, 9 Drawing Sheets

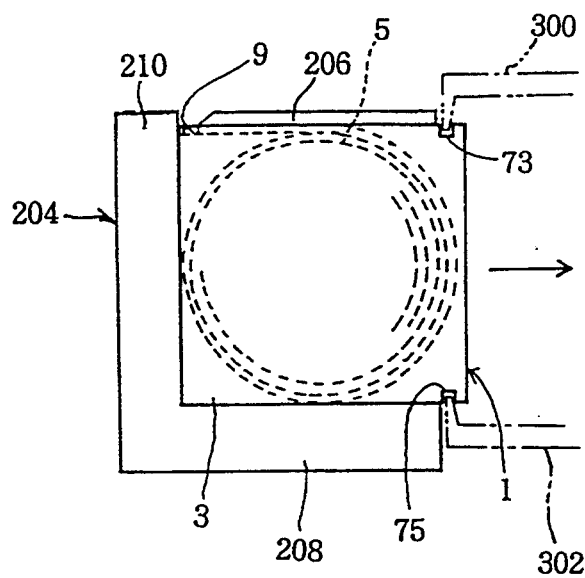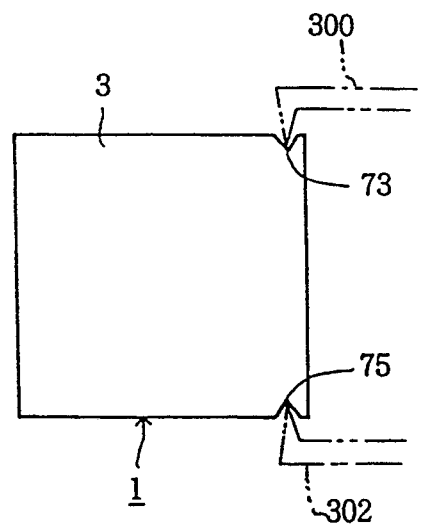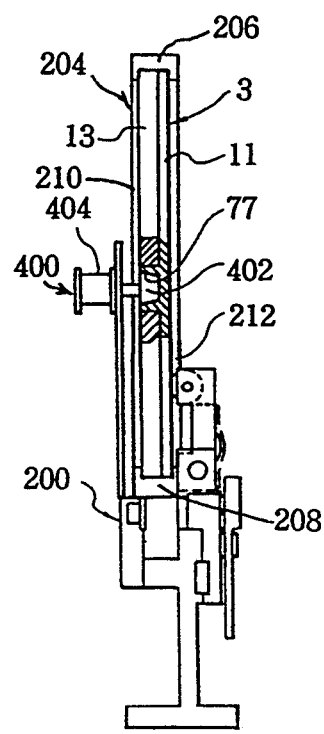

ELECTRONIC COMPONENT PACKAGING MEANS, AND SUPPLY MECHANISM FOR AND METHOD OF SUPPLYING ELECTRONIC COMPONENTS BY USING THE ELECTRONIC COMPONENT PACKAGING MEANS

BACKGROUND OF THE INVENTION

1. Field of the Invention

This invention relates to electronic component packaging means for packing surface-mounted-type electronic components (hereinafter referred to as "electronic components"), and a supply mechanism for and a method of supplying electronic components by using the packaging means. More particularly, this invention relates to packaging means for packing electronic components for storage and transportation as well as for supplying electronic components to a mounting head of an automatic electronic component mounting apparatus when the mounting head is to mount electronic components on printed circuit boards, and a supply mechanism for and a method of supplying electronic components to the mounting head by using the packaging means.

2. Description of the Prior Art

Hitherto, an automatic electronic component supplying mechanism having a bulk-type storage cassette is widely used as means to feed surface-mounted-type electronic components to a mounting head of an automatic electronic component mounting apparatus, since a plurality of surface-mounted-type electronic components can be stored in bulk in the bulk-type storage cassette and the electronic components received in the bulk-type storage cassette can be fed to the mounting head one by one.

This kind of bulk-type storage cassette is disclosed in Japanese patent application which was laid open to public inspection under provisional publication No. 280129/1987.

The storage cassette comprises a body having a storage chamber formed in its interior for storing a plurality of electronic components in bulk, an electronic component passageway formed at a bottom of the storage chamber, and an outlet formed at a terminal end of the passageway. In order to permit the electronic components received within the storage chamber to move downward by gravity, the interior of the storage chamber is formed into a substantially mortar-shape or funnel-shape. Alternatively, the body of the storage cassette is obliquely arranged in a manner that the storage chamber is inclined. The electronic components received within the storage chamber are adapted to move downward by gravity and travel on the passageway to be discharged one by one out of the body through the outlet.

In the conventional electronic component supply mechanism having the storage cassette, the storage cassette is arranged with the outlet thereof being located at a lower and side position, so that when a mounting head is moved downward with respect to the outlet in order to directly receive an electronic component discharged from the outlet, the storage cassette will interfere with the downward movement of the mounting head. Also, there is a possibility that the mounting head will fail to receive an electronic component discharged from the outlet. In order to avoid such trouble, a suction head or receiving base, which is adapted to directly receive an electronic component discharged from the outlet, is employed. The suction head or receiving base is arranged close to the outlet. The suction head or receiving base which receives the electronic component is adapted to be moved laterally away from the outlet. When the suction head or receiving base is moved laterally and arrives at a predetermined position where vertical movement of the mounting head is not interrupted by the storage cassette, the mounting head is moved downward with respect to the electronic component received by the suction head or receiving base and takes up the electronic component from the suction head or receiving base to mount the electronic component on a printed circuit board.

In the conventional supply mechanism, the outlet of the storage cassette is located at a lower and side position as described above. Therefore, if an X-Y table on which a printed circuit board is carried is arranged on the side of the storage cassette which is opposite to the side of the storage cassette on which the suction head or receiving base is arranged, this will require the mounting head to move in several directions. More particularly, in addition to the vertical movement, the mounting head after taking up an electronic component from the suction head or receiving base has to move round about the storage cassette or has to go over the storage cassette in order to mount the electronic component on the printed circuit board carried on the X-Y table. This is undesirable for high-speed mounting of electronic components. In order to eliminate such inconvenience, the X-Y table on which a printed circuit board is carried is forced to be arranged on the side of the storage cassette only, on which the suction head or receiving base is arranged. Thus, the arranging position of the X-Y table is restricted. In addition, the conventional supply mechanism includes the suction head or receiving base as an indispensable part thereof, so that the supply mechanism is complex in construction and high in manufacturing cost.

One example of packaging means, which is adapted to pack electronic components for storage and transportation and is also adapted to be used as an electronic component supply source, is disclosed in Japanese utility model application (in the name of TDK Corporation) which was laid open to public inspection under provisional publication No. 111682/1990 on Sep. 6, 1990.

The packaging means disclosed in the above utility model application comprises a substantially disk-like body. The body comprises a substantially disk-like base portion and a substantially disk-like cover portion. The disk-like base portion has a spiral groove formed in one surface thereof, an outlet formed at a side portion thereof as a continuation of an outermost portion of the spiral groove, and a plurality of air-intakes, the air-intakes being formed at respective circular portions of the spiral groove to communicate between the spiral groove and the exterior of the disk-like base portion. A plurality of electronic components are received in a row in the spiral groove of the disk-like base portion. The disk-like cover portion is mounted on a spirally grooved surface of the disk-like base portion.

When the electronic component packaging means is used as an electronic component supply source, the electronic component packaging means is adapted to be supported on a base of an electronic component supply mechanism so as to stand on the base with the outlet being located at a lower and side position. Also, when the packaging means is supported on the base, the air-intakes of the packaging means are adapted to be connected through coupling means to an air supply source which is adapted to intermittently feed air. Air intermittently supplied from the air supply source flows into the spiral groove through the air-intakes, whereby the electronic components received in the spiral groove are moved toward the outlet along the spiral groove and then discharged one by one from the outlet. An electronic component discharged from the outlet of the packaging means is received by receiver means which is arranged close to the outlet of the packaging means and adapted to be moved laterally. The receiver means which receives an electronic component discharged from the outlet is laterally moved away from the outlet to a position below a waiting position of a mounting head of an electronic component mounting apparatus. Then, the mounting head is moved downwardly with respect to the receiver means to hold, via suction, the electronic component received by the receiver means. The mounting head holding the electronic component is moved upwardly and then moved toward a printed circuit board to mount the electronic component on the printed circuit board. The packaging means is preferred in terms of storage and transportation because it is compact and has the spiral groove permitting a plurality of electronic components to be received therein.

As described above, the packaging means is designed so that the outlet formed at the side of the body of the packaging means is located at a lower and side position when the packaging means is supported on the base of the electronic component supply mechanism. Therefore, if an X-Y table on which a printed circuit board is carried is arranged on the side of the packaging means, which is opposite to the side of the packaging means on which the receiver means is arranged, this will require the mounting head to move in several directions as just the mounting head in the above-described conventional electronic component supply mechanism is required to do so. In order to eliminate such inconvenience, the X-Y table is forced to be arranged on the side of the packaging means only on which the receiver means is arranged. Thus, the arranging position of the X-Y table is restricted. Furthermore, the electronic component supply mechanism which is adapted to supply electronic components using the packaging means includes the receiver means as an indispensable part thereof, so that the supply mechanism is complex in construction and high in manufacturing cost.

As described above, when the packaging means is used as an electronic component supply source, it is adapted to be supported on the base of the electronic component supply mechanism with the body standing on the base. The electronic components contained in the body of the packaging means are moved toward the outlet along the spiral groove by air intermittently fed into the spiral groove through the air-intakes. The intermittent feeding of air into the body through the air-intakes is adapted to be carried out each time one electronic component is discharged out of the body through the outlet. When air is fed into the spiral groove through the air-intakes, the electronic components received in the spiral groove are moved toward the outlet along the spiral groove while colliding with one another. Also, when the feeding of air into the spiral groove through the air-intakes is stopped, electronic components, which have been moved to upper regions of respective circular portions of the spiral groove of the packaging means standing on the base of the electronic component supply mechanism, are moved toward lower regions of the respective circular portions of the spiral groove by gravity while colliding with one another. Such collision of the electronic components with one another will be brought about each time the feeding of air is carried out and stopped. Repeated collision of the electronic components with one another, may result in the electronic components being damaged and/or may result in characteristics of the electronic components deteriorating. Therefore, in the conventional packaging means, it is necessary to reduce possibilities that electronic components contained in the packaging means will collide with one another during the movements of the electronic components along the spiral groove.

SUMMARY OF THE INVENTION

The present invention has been made with a view to overcoming the foregoing problems of the prior art.

It is therefore an object of the present invention to provide packaging means for packing electronic components for storage and transportation as well as for supplying electronic components to a mounting head of an automatic electronic component mounting apparatus, which packaging means permits the mounting head to directly take each of electronic components out of the packaging means.

It is another object of this invention to provide electronic component packaging means which can be used as an electronic component supply source without causing the arranging position of carrying means, on which carrying means a printed circuit board is carried, to be restricted.

It is still another object of this invention to provide electronic component packaging means which can faciliate mounting of electronic components on printed circuit boards by the mounting head without causing the mounting head to be moved in many directions.

It is yet another object of this invention to provide electronic component packaging means which can facilitate reducing of the number of colliding of electronic components with one another during the movements of electronic components along a spiral passageway of the packaging means.

It is still a further object of this invention to provide a method and apparatus for supplying electronic components to the mounting head by using the electronic component packaging means as stated above.

BRIEF DESCRIPTION OF THE DRAWINGS

These and other objects and many of the attendant advantages of the present invention will be readily appreciated as the same becomes better understood by reference to the following detailed description when considered in connection with the accompanying drawings, in which like reference numerals designate the same parts throughout the Figures and wherein:

FIGS. 23A and 23B are schematic views of a pair of chucking pawls and the packaging means having engaging recesses;

FIG. 24 is a schematic side elevation of positioning means for positioning the packaging means;

DETAILED DESCRIPTION OF THE PREFERRED EMBODIMENTS

Electronic component packaging means according to the present invention is used as means to pack chip-type electronic components therein for storage and transportation and also used as a supply source to feed the electronic components to a mounting head of an automatic electronic component mounting apparatus.

Figure 1:
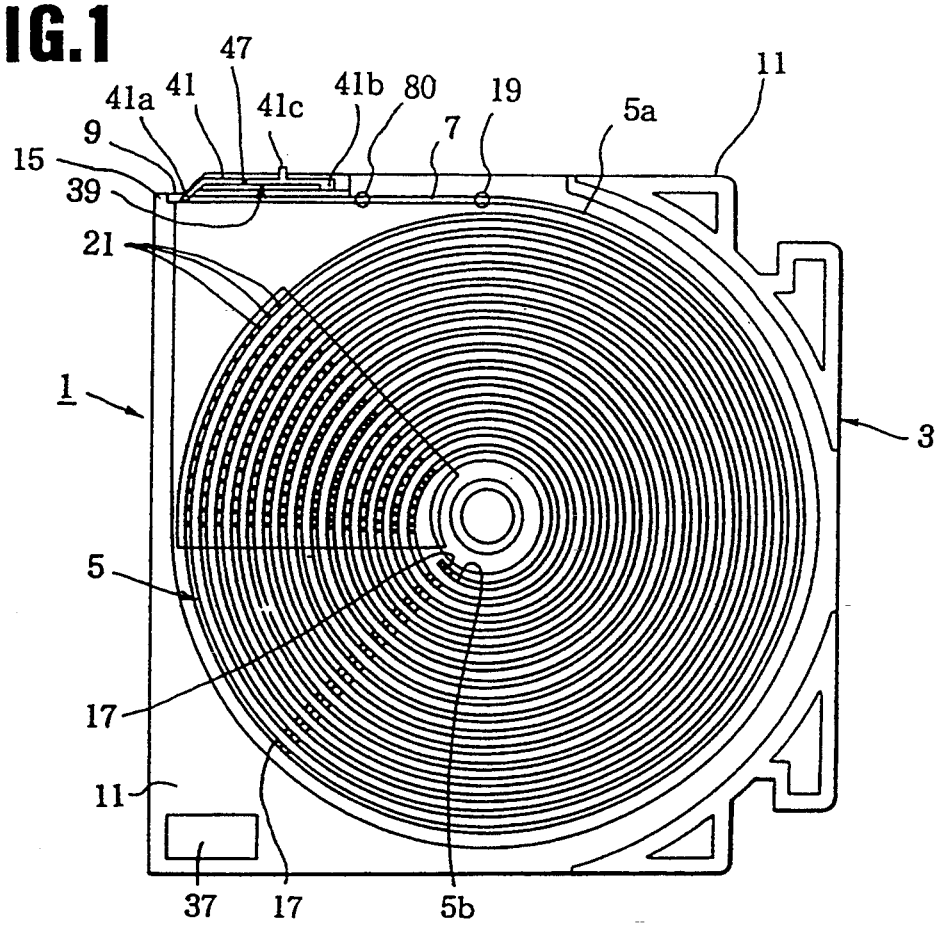
FIG. 1 is a schematic front view of the preferred embodiment of electronic component packaging means according to the present invention.
Figure 2:
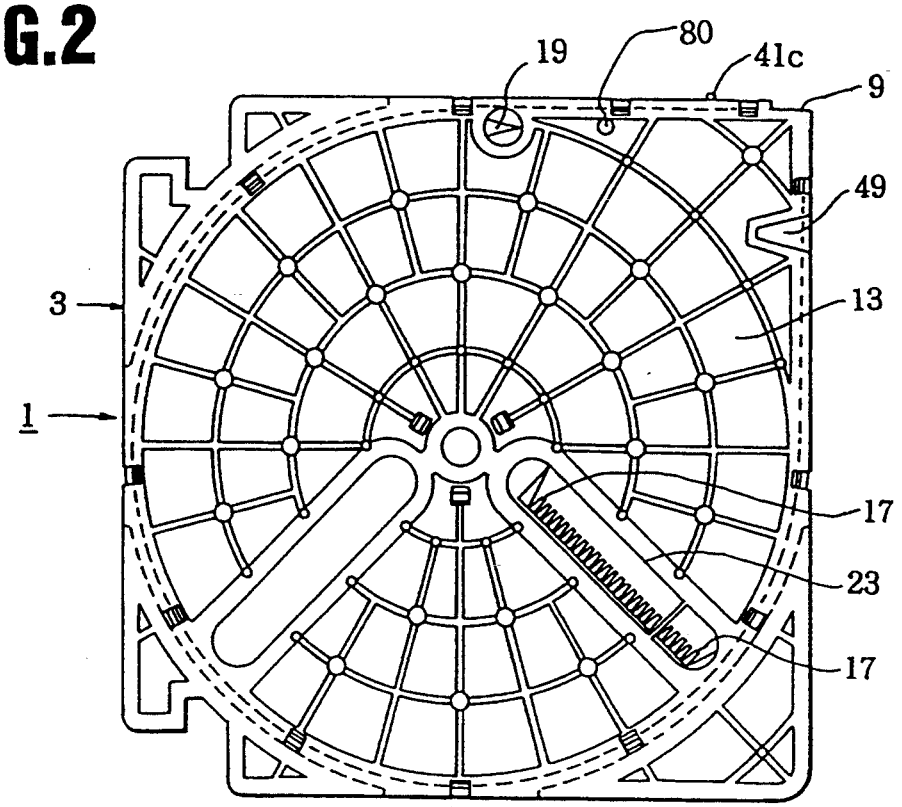
FIG. 2 is a schematic rear elevation of the electronic component packaging means.
Figure 3:
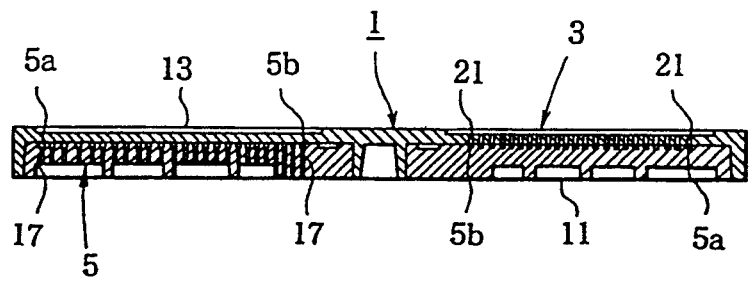
FIG. 3 is a schematic sectional view of the electronic component packaging means.

Referring now to FIGS. 1, 2 and 3, there is illustrated the electronic component packaging means 1. The electronic component packaging means 1 comprises a substantially plate-like casing body 3. The casing body 3 has a substantially spiral passageway 5 formed in its interior, a linear passageway 7 formed therein as a continuation of an outermost circular portion 5a of the spiral passageway 5, and an electronic component outlet 9 formed therein to communicate between an end of the linear passageway 7 and the exterior of the casing body 3. A plurality of electronic components (not shown) are received in a row in the spiral passageway 5. More particularly, in the illustrated embodiment, the plate-like casing body 3 comprises a base plate 11 and a cover plate 13 as shown in FIG. 3. Each of the spiral passageway 5 and linear passageway 7 is formed in one surface side of the base plate 11 and takes the form of a groove having a substantially U-like configuration in vertical section which is suitable for receipt of electronic components. The cover plate 13 is mounted on a grooved surface of the base plate 11. As will be described in greater detail hereinafter, the electronic component packaging means 1, when it is used as an electronic component supply source, is adapted to be supported on a base of an electronic component supply mechanism with the casing body 3 standing on the base of the electronic component supply mechanism and with the outlet 9 of the casing body 3 being located at an upper position. The end of the linear groove 7 is blocked up by an end wall 15. The outlet 9 is formed in a portion of an upper wall of the linear groove 7, which is close to the end wall 15, to communicate between the linear groove 7 and the exterior of the casing body 3, and takes the form of an opening.

The base plate 11 further has a plurality of main air-intakes 17 formed at respective circular portions of the spiral groove 5 to communicate between the spiral groove 5 and the exterior of the casing body 3. The air-intakes 17 are disposed in a row along a radial direction from an innermost circular portion 5b of the spiral groove 5 to the outermost circular portion 5a of the spiral groove 5 and formed within a lower half area of the base plate 11 of the casing body 3 standing on the base of the electronic component supply mechanism when the packaging means 1 is used as the electronic component supply source. Also, an auxiliary air-intake 19 may be formed at of an initial end portion of the linear passageway 7 extending from the outermost circular portion 5a of the spiral passageway 5. The auxiliary air-intake 19 communicates between the linear passageway 7 and the exterior of the casing body 3. Each of the air-intakes 17 and 19 takes the form of a through-hole.

The cover plate 13 has a plurality of air-outtakes 21 formed in portions thereof which positionally correspond to the respective circular portions of the spiral groove 5 when the cover plate 13 is mounted on the base plate 11 for assembly. The air-outtakes 21 communicate between the spiral groove 5 and the exterior of the casing body 3 when the cover plate 13 is mounted on the base plate 11. Also, the air-outtakes 21 are disposed in rows along a radial direction from a central portion of the cover plate 13 to a peripheral portion of the cover plate 13 within an upper half area of the cover plate 13 of the casing body 3 standing on the base of the electronic component supply mechanism when the electronic component packaging means 1 is used as the electronic component supply source. Each of the air-outtakes 21 takes the form of a through-hole.

As shown in FIG. 2, the base plate 11 further has a rising frame portion 23 of a substantially ring-shape formed on a back side thereof in a manner to surround the main air-intakes 17. When the packaging means 1 is used as the electronic component supply source, a coupling connected to an air supply source which is adapted to intermittently feed air is adapted to be fitted in the frame portion 23. Also, the auxiliary air-intake 19 is adapted to be connected to the air supply source. When air is fed through the air-intakes 17 and 19 into the passageways 5 and 7 of the packaging means 1 from the air supply source, the electronic components received in the spiral passageway 5 are moved toward the outlet 9 along the spiral passageway 5 and linear passageway 7. During the movement of the electronic components toward the linear passageway 7, air fed into the spiral passageway 5 through the air-intakes 17 escapes from the air-outtakes 21, whereby the electronic components can be smoothly moved toward the linear passageway 7. When foremost one of the electronic components arrives at the outlet 9 and is stopped against the end wall 15, a mounting head of an automatic mounting apparatus for mounting electronic components on printed circuit boards is moved downwardly with respect to the outlet 9 to hold the foremost electronic component via suction and then moved upwardly while still holding the electronic component via suction as will be described in greater detail hereinafter. Thus, the electronic components contained in the casing body 3 are taken out of the casing body 3 of the packaging means 1 one by one by means of the mounting head.

In order to effectively apply air from the air supply source through the air-intakes 17 and 19 to the electronic components contained in the casing body 3, it is desirable that each of the air-intakes 17 and 19 is formed in a manner to ascend obliquely from the back side of the casing body 3 toward the direction in which the electronic components contained in the spiral passageway 5 are moved toward the outlet 9 by air fed from the air supply source. Forming of the air-intakes 17 and 19 in the base plate 11 of the casing body 3 may be effected after manufacturing of the base plate 11 is completed. However, this is troublesome. Therefore, it is preferred that when the base plate 11 is produced by injection molding or die casting, the air-intakes 17 and 19 are simultaneously formed. Where the forming of the air-intakes is carried out simultaneously with the forming of the base plate 11 by injection molding or die casting, a plurality of thin pins for forming the air-intakes 17 and 19 are provided on a surface of a mold or die, which mold or die is used for forming of the base plate 11, in a manner to stand upwardly from the surface of the mold or die. Also, in order to form the air-intakes 17 and 19, which obliquely extend toward the electronic component forwarding direction as described above, each of the pins must be inclined at an angle corresponding to a predetermined inclination of each of the air-intakes 17 and 19. Therefore, when a finished base plate 11 produced by injection molding or die casting is separated from the mold or die, the separating of the base plate 11 from the mold or die must be performed while causing the base plate 11 to be moved in an oblique direction along the inclined pins. This is troublesome. In addition to this, there is a possibility that the inclined pins of the mold or die will be harmed during the separating of the base plate 11 from the mold or die.

In order to solve the above-mentioned problems, it is desirable that each of the air-intakes 17 and 19 has a form facilitating the separating of a finished base plate from a mold or die without damaging the mold or die as will be discussed in greater detail hereinafter. While only the air-intakes 17 will be referred to in the following, the auxiliary air-intake 19 is formed in the same manner as the air-intakes 17 are done.

Figure 4:
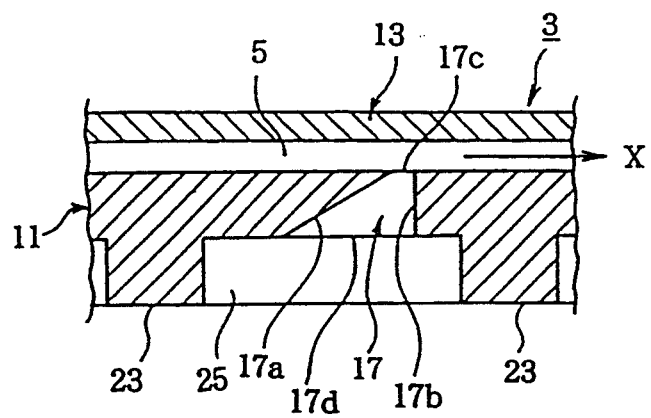
FIG. 4 is a schematic enlarged fragmentary sectional view of a casing body.

Referring now to FIG. 4, each of the air-intakes 17 (only one is shown in FIG. 4) takes the form of a through-hole broadening from a portion thereof near the spiral passageway 5 toward a portion thereof near the back side of the base plate 11. The base plate 11 has a recess 25 surrounded by the ring-like rising frame 23. The through-hole 17 includes a first surface 17a constituting a rear surface relative to the electronic component forwarding direction X, and a second surface 17b constituting a front surface relative to the electronic component forwarding derection X. The first surface 17a constitutes a slope ascending obliquely from the back side of the base plate 11 toward the electronic component forwarding direction X. The slope 17a is inclined at an angle of about 30° to a horizontal plane of the base plate 11. The surface 17b may be at right angles to the horizontal plane of the base plate 11 or may constitute an steeply ascending slope. In FIG. 4, the surface 17b is at right angles to the horizontal plane of the base plate 11. An opening 17c of the air-intake 17 which communicates with the spiral passageway 5 has a size smaller than that of each of the electronic components contained in the spiral passageway 5. Also, an opening 17d of the air-intake 17 which is near the recess portion 25 of the base plate 11 is relatively large. Thus, the air-intake 17 becomes narrow as the air-intake 17 extends from the back side of the base plate 11 to the spiral passageway 5 as shown in FIG. 4.

Figure 5:
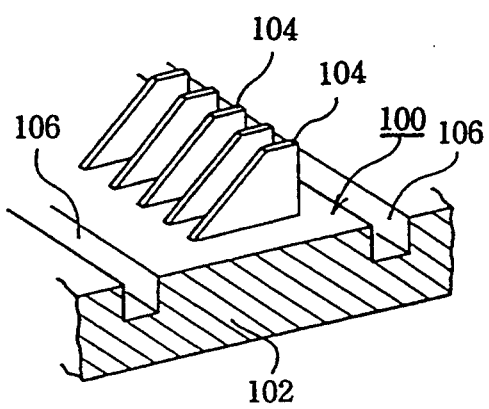
FIG. 5 is a schematic enlarged fragmentary perspective view of a mold or die for forming a base plate of the casing body.
Figure 6:
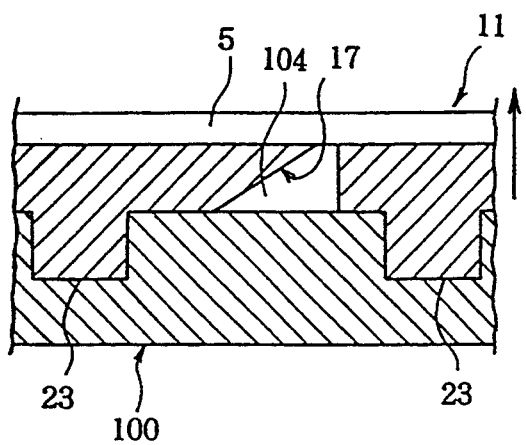
FIG. 6 is a schematic enlarged fragmentary sectional view of the base plate and the mold or die.

The forming of the base plate 11 is carried out by using a pair of molds or dies which are adapted to be fitted together thereby forming the base plate 11. In FIG. 5, only one of the molds or dies is shown. The mold or die 100 comprises a body 102 and a plurality of projecting pieces 104 for forming air-intakes. The projecting pieces 104 are projected upwardly from a surface of the body 102 and spaced at predetermined intervals. Each of the projecting pieces 104 is of a substantially trapezoid shape corresponding to the shape of the air-intake 17. As described above, the base plate 11 has the substantially ring-like frame portion 23 (see FIGS. 2 and 4) formed on the back side thereof in a manner to surround the air-intakes 17. In order to form the ring-like frame portion 23, a ring-like groove 106 is provided in the surface portion of the body 102 of the mold or die 100 in a manner to surround the projecting pieces 104. When a plurality of air-intakes 17 are to be disposed in a row as shown in FIG. 1, the projecting pieces 104 are disposed in a row on the surface of the mold or die 100. Also, recesses (not shown) for forming reinforcing ribs on the base plate 11 may be provided in the body 102 of the mold or die 100. In order to form the spiral groove 5 and the linear groove 7 in the base plate 11, the none-shown mating mold or die has a substantially spiral protrusion and a linear protrusion extending as a continuation of the spiral protrusion. The base plate 11 is formed into a predetermined shape by using the molds or dies constructed as described above. A root portion of each of the projecting pieces 104 of the mold or die 100 has a width more than that of an upper portion of each of the projecting pieces 104, so that removal of a finished base plate 11 from the mold or die 100 can be easily performed by only causing the finished base plate 11 to be straightly moved away from the mold or die 100 as indicated by the arrow in FIG. 6. In addition to this, there is no possibility that the projecting pieces 104 of the mold or die 100 will be damaged during the removal of the finished base plate 11 from the mold or die 100.

Figure 7:
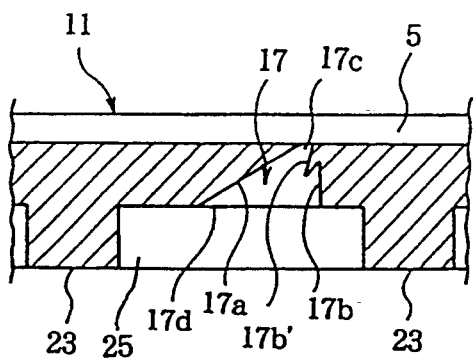
FIG. 7 is a schematic enlarged fragmentary sectional view of a first modification of the base plate shown in FIG. 5.

Referring to FIG. 7, there is illustrated a modification of the base plate 11 shown in FIG. 4. This modification is substantially similar to the base plate 11 shown in FIG. 4 except that the surface 17b of the through-hole 17 has an air-guide fin 17b' formed thereon in a manner to extend obliquely from the opening 17c toward the slope 17a. Bearing on this, each of the projecting pieces 104 of the mold or die 100 is provided at its vertical surface side with a cutout (not shown) for forming the air-guide fin 17b'. In FIG. 7, elements which are similar to those shown in FIG. 4 are designated with like reference numerals and the description of them will not be repeated.

Figure 8:
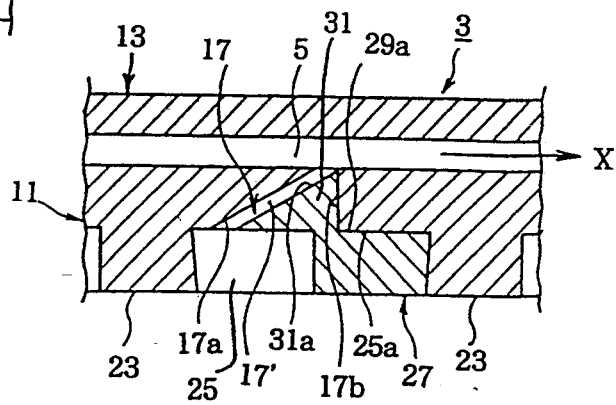
FIG. 8 is a schematic enlarged fragmentary sectional view of a second modification of the base plate shown in FIG. 5.
Figure 9:
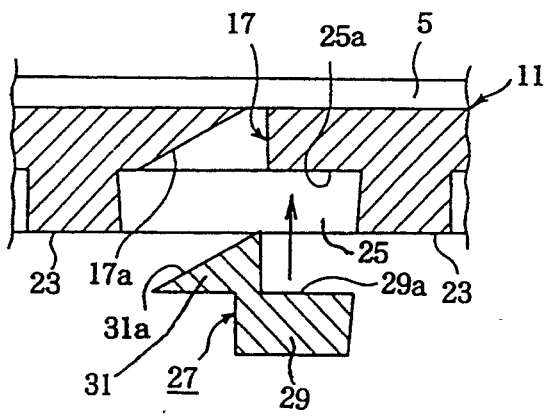
FIG. 9 is a schematic enlarged fragmentary sectional view of assistance in explaining the manner of forming the base plate shown in FIG. 8.
Figure 10:
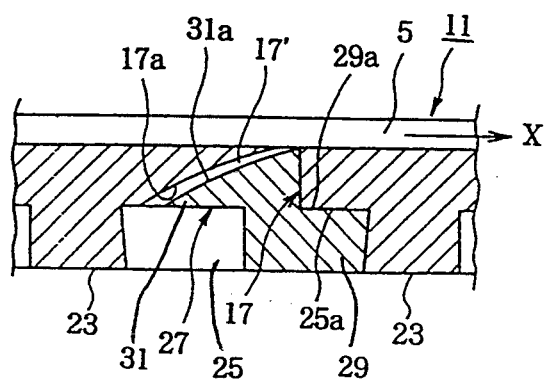
FIG. 10 is a schematic enlarged fragmentary sectional view of a third modification of the base plate shown in FIG. 5.

Referring to FIGS. 8, 9 and 10, there is illustrated another modification of the base plate 11 shown in FIG. 4. This modification is substantially similar to the base plate 11 shown in FIG. 4 except that a plate-like piece 27 is fixedly fitted in the through-hole 17. In FIGS. 8 to 10, elements which are similar to those shown in FIG. 4 are designated with like reference numerals and the description of them will not be repeated. The plate-like piece 27 is adapted to be fitted into the through-hole 17 from the recess portion 25 as indicated by the arrow in FIG. 9. The plate-like piece 27 includes a substantially rectangular section 29 and a substantially right-angled triangular section 31. A slope 31a of the triangular section 31 corresponds in an angle to the slope 17a of the through-hole 17. When the plate-like piece 27 is fitted in the through-hole 17 for assembly, a top surface 29a of the rectangular section 29 is engaged with an upper surface 25a of the recess portion 25 and a vertical surface of the triangular section 31 is mated with the surface 17b of the through-hole 17, whereby the plate-like piece 27 is positioned with respect to the base plate 11. Thus, an air-intake 17' of a substantially straight slit form is provided between the slope 17a of the through-hole 17 and a slope 31a of the triangular section 31. The fitting of the plate-like piece 27 into the through-hole 17 is carried out after the base plate 11 is formed by the molds or dies. Each of the slope 17a of the through-hole 17 and the slope 31a of the plate-like piece 27 may be curved as shown in FIG. 10. In this case, an air-intakes 17' of a substantially curved slit form is provided between the slope 17a of the through-hole 17 and the slope 31a of the plate-like piece 27.

Figure 11:
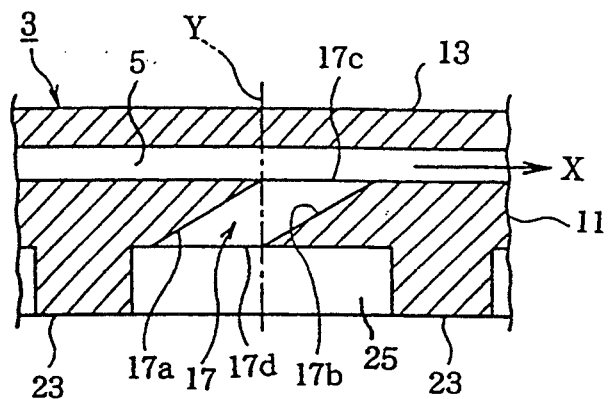
FIG. 11 is a schematic enlarged fragmentary sectional view of a fourth modification of the base plate shown in FIG. 5.
Figure 12:
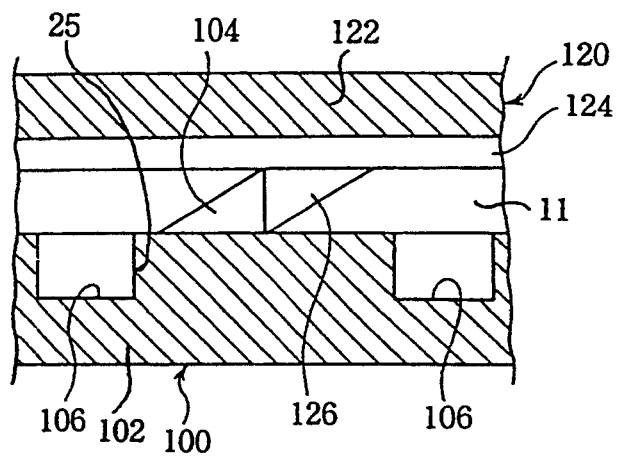
FIGS. 12 and 13 are schematic enlarged fragmentary sectional views of assistance in explaining the manner of forming the base plate shown in FIG. 11.
Figure 13:
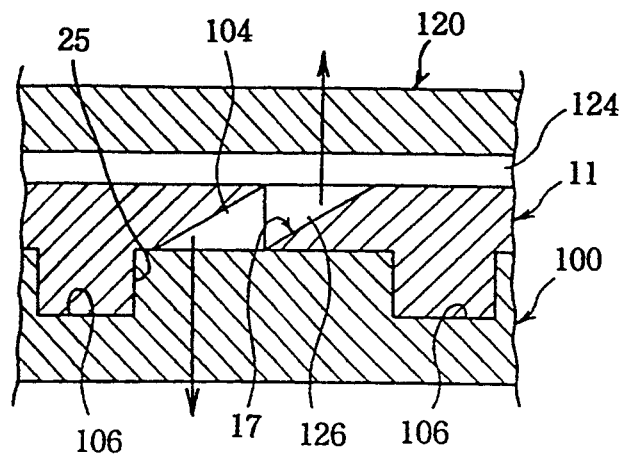

Referring to FIG. 11, there is illustrated a further modification of the base plate 11 shown in FIG. 4. In FIG. 11, elements which are similar to those shown in FIG. 4 are designated with like reference numerals and the description of them will not be repeated. In this modification, the surface 17b of the through-hole 17 constitutes a slope obliquely extending in parallel with the opposite slope 17a of the through-hole 17. Also, an upper end of the slope 17a and a lower end of the slope 17b are aligned with each other on a vertical line Y to the horizontal plane of the casing body 3. Thw forming of the base plate 11 is effected using first and second molds or dies 100 and 120 shown in FIGS. 12 and 13. The first mold or die 100 includes a body 102 and a plurality of substantially right-angled triangle-shaped pieces 104 (only one is shown in FIGS. 12 and 13) standing upward from a surface of the body 102. The second mold or die 120 includes a body 122, a substantially spiral protrusion 124 for forming the spiral groove 5, and a linear protrusion (not shown) for forming the linear groove 7. The substantially spiral protrusion 124 is formed on an undersurface of the body 122. Also, the none-shown linear protrusion is formed on the undersurface of the body 122 in a manner to extend as a continuation of the spiral protrusion 124. The body 122 further has a plurality of substantially right-angled triangle-shaped pieces 126 (only one is shown in FIGS. 12 and 13) projecting downward from undersurfaces of regions of respective circular portions of the spiral protrusion 124. The pieces 126 of the first mold or die 120 correspond in number to the pieces 104 of the first mold or die 100. Each of the pieces 104 of the first mold or die 100 is formed on the body 102 in a manner to be mated at its vertical surface with a vertical surface of the corresponding one of the pieces 126 of the second mold or die 120 as shown in FIGS. 12 and 13 when the first mold or die 100 and the second mold or die 120 are fitted together for forming a base plate 11. The removal of a finished base plate 11 from the first and second molds or dies 100 and 120 can be easily effected by only causing the first and second molds or dies 100 and 120 to be straightly moved apart from each other as indicated by the arrows in FIG. 13.

Thus, it will be noted that the air-intakes of the predetermined shapes shown in FIGS. 4 and 6 to 13 facilitate the separating of a finished base plate from the molds or dies. In addition, the air-intakes of the predetermined shapes shown in FIGS. 4 and 6 to 13 can permit the separating of a finished base plate from the molds or dies to be performed without bringing about the damage of the molds or dies.

When the electronic components contained in the casing body 3 are moved toward the outlet 9 along the spiral groove 5 and the linear groove 7 by air fed from the air supply source, static electricity may be produced between the electronic components and the grooves 5 and 7, resulting in the electronic components being prevented from smoothly sliding on the bottom surface of the grooves 5 and 7. In order to avoid such trouble, the casing body 3 may be made of material which can prevent the generation of static electricity between the electronic components and the grooves 5 and 7. As an example of an antistatic material, there may be employed material which consists essentially of a mixture of synthetic resin, for example, polyacetal resin commercially available as "DURACON" (provided by Du Pont Company), with antistatic powder such as carbon powder or other antistatic metal powders. Preferably, about 10–30 weight percent (wt. %), and better yet about 15 wt. % antistatic powder is present in the material. When the casing body 3 comprises the base plate 11 and the cover plate 13, only the base plate 11 may be formed of the material which can prevent the generation of static electricity between the electronic components and the passageways. Preferably, the cover plate 13 is made of transparent resin material, to thereby permit viewing the interior of the packaging means 1. In the illustrated embodiment, the cover plate 13 is made of transparent resin material. Where the casing body 3 comprises the base plate 11 and the cover plate 13 which are made of resin material, the casing body 3 is assembled by causing the cover plate 13 to be removably fitted on the base plate 11. Alternatively, the casing body 3 may be assembled by high-frequency bonding a peripheral portion of the cover plate 13 to a peripheral portion of the base plate 11. In lieu of the above described material, the casing body 3 may be formed of metal, which can prevent the generation of static electricity between the electronic components and the passageways 5 and 7, selected from the group consisting of aluminum, iron and copper. When the casing body 3 is made of aluminum, the whole casing body 3 including the passageways 5 and 7 can be easily formed into a predetermined shape by die casting. Even when metal is employed, only the base plate 11 having the grooves 5 and 7 formed therein may be made of such metal as can prevent the generation of static electricity, or the base plate 11 and the cover plate 13 may be both made of such metal.

When the electronic components contained in the casing body 3 are to be taken out of the casing body 3 one by one by the mounting head, the mounting head waiting at a position above the outlet 9 of the casing body 3 is moved downwardly with respect to the outlet 9 of the casing body 3 to be inserted at a suction nozzle thereof into the outlet 9 of the casing body 3. Then, the suction nozzle of the mounting head comes into contact with an electronic component, which is moved to the end of the linear passageway 7 along the spiral passageway 5 by air fed from the air supply source, to hold the electronic component via suction and takes the electronic component out of the casing body 3 by upward movement of the mounting head. The suction nozzle of the mounting head is adapted to go in and out of the outlet 9 of the casing body 3. When the suction nozzle of the mounting head goes in and out of the outlet 9 of the casing body 3, the suction nozzle of the mounting head will accidentally touch walls surrounding the outlet 9 of the casing body 3, whereby the walls surrounding the outlet 9 of the casing body 3 may be damaged. Also, the outlet portion 9 of the casing body 3 is exposed to the exterior, so that the outlet portion 9 of the casing body 3 may be damaged by any external force which will be accidentally applied to the outlet portion 9 of the casing body 3. Therefore, it is necessary that the outlet portion 9 of the casing body 3 should be so devised as to resist any external force. In addition, in order that the suction nozzle of the mounting head may positively take an electronic component out of the outlet 9 of the casing body 3, it is necessary that the outlet portion 9 of the casing body 3 should be formed into a high precision shape.

To meet such demands, the whole casing body 3 should be made of metal. However, where complex configurations of respective portions of the casing body 3 are provided by a metallurgical process, manufacturing costs of the casing body 3 will rise. When the casing body 3 is manufactured by plastic molding, the casing body 3 can be provided at low cost. Therefore, it is desirable that the whole casing body 3 is manufactured by plastic molding. However, plastic material is delicate and susceptible to damage.

In view of the above, the casing body 3 itself is made of plastic material while the outlet portion 9 of the casing body 3 may be formed of metal. More particularly, the outlet portion 9 may take the form of a metal cap as will be described in greater detail hereinafter.

Figure 14:
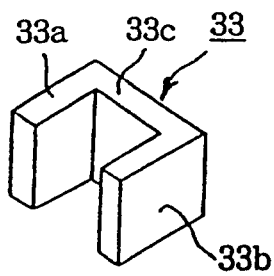
FIG. 14 is a schematic enlarged perspective view of a metal cap.

Referring now to FIG. 14, there is illustrated a metal cap 33 which comprises a substantially U-shaped body. In view of formability and rigidity, the cap 33 should be formed of, for example, aluminum, stainless steel or the like. The body of the cap 33 comprises a pair of spaced apart sections 33a and 33b, and an intermediate section 33c interconnecting the spaced apart sections 33a and 33b. The cap 33 is made of metal, so that the overall size of the cap 33 can be precisely provided. In addition to this, each of the inside faces of the U-shaped cap 33 can be flatly finished.

Figure 15:
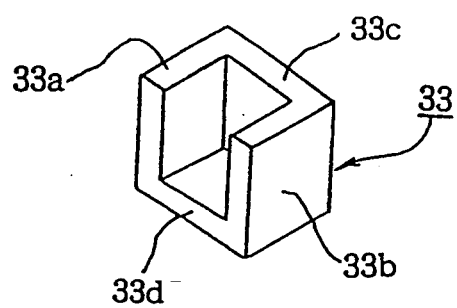
FIG. 15 is a schematic enlarged perspective view of a first modification of the metal cap shown in FIG. 14.

Referring to FIG. 15, there is illustrated a modification of the metal cap 33 shown in FIG. 14. This modification is substantially similar to the metal cap 33 shown in FIG. 14 except that a base section 33d is integrally formed on an underside of the U-shaped body.

Figure 16:
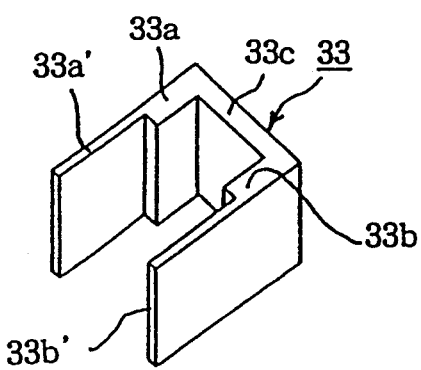
FIG. 16 is a schematic enlarged perspective view of a second modification of the metal cap.

Referring to FIG. 16, there is illustrated another modification of the metal cap 33 shown in FIG. 14. This modification is substantially similar to the metal cap 33 of FIG. 14 except that the U-shaped body has a pair of engaging arms 33a' and 33b' extending linearly from free ends of the spaced apart sections 33a and 33b.

Figure 17:
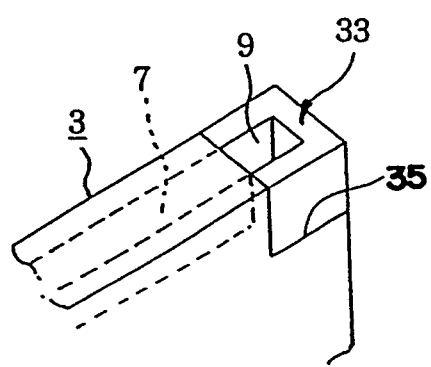
FIG. 17 is a schematic enlarged fragmentary perspective view of the casing body having the metal cap of FIG. 14 attached thereto.

FIG. 17 shows the metal cap 33 of FIG. 14 which is attached to the casing body 3. Where the metal cap 33 is employed, an end portion of the linear passageway 7 of the casing body 3 is cut away. The height and width of the cap 33 respectively correspond to the height and width of a cutout 35 of the casing body 3. The metal cap 33 is fixedly fitted in the cutout 35 of the casing body 3 with an internal space thereof being aligned with the linear passageway 7 of the casing body 3. The metal cap 33 of FIG. 15 is fixedly mounted in the cutout 35 of the casing body 3 in the substantially same manner as the metal cap 33 of FIG. 14 is done. The metal cap 33 of FIG. 16 is fixedly fitted in the cutout 35 of the casing body 3 in a manner that the engaging arms 33a' and 33b' are engaged with outer surfaces of both side walls of the linear passageway 7.

Where the metal cap 33 is employed, the space surrounded by the spaced apart sections 33a and 33b and intermediate section 33c of the metal cap 33 constitutes the outlet 9. An electronic component which arrives at the metal cap 33 due to feeding of air into the casing body 3 can be positioned by the metal cap 33. Also, the cap 33 is made of metal, so that even though the suction nozzle of the mounting head accidentally touches the inside faces of the cap 33 when the suction nozzle of the mounting head goes in and out of the outlet 9, there is no possibility that the sections 33a, 33b and 33c of the cap 33 which surround the space constituting the outlet 9 will be extremely frayed. In addition to this, the space constituting the outlet 9 is surrounded by the sections 33a, 33b and 33c which are made of metal, so that the outlet 9 can be precisely formed.

Where different kinds of electronic components are required to form an electric circuit on a single printed circuit board, it is necessary that a plurality of packaging means 1 having different kinds of electronic components are prepared. In this case, it is necessary to rapidly grasp what type of electronic component is contained in the casing body 3 of each of the packaging means 1. By rapid grasping of such matter, a plurality of packaging means having different kinds of electronic components, which are required to form an electric circuit on a single printed circuit board, can be rapidly prepared. Further, when electronic components contained in certain packaging means are all taken out by the mounting head, resulting in the packaging means being emptied, the emptied packaging means can be quickly replaced by new packaging means having the same type of electronic component contained therein. If the type of electronic component contained in each of the packaging means can be quickly seen, this is also favorable in terms of sorting of a plurality of packaging means, managing of the packaging means, and packing of the packaging means for forwarding to the destinations of the packaging means.

To meet the above described demands, an identifying mark 37 for facilitating the managing of a plurality of packaging means may be applied to the casing body 3 of the packaging means 1 as shown in FIG. 1, which identifying mark 37 has data on the kind of electronic component contained in the casing body 3, parts number, manufacturing date and the like. The identifying mark 37 may be formed by directly printing the data on the casing body 3, or adhering any suitable label, having the data printed thereon, to the casing body 3. The printing may be magnetic printing. Alternatively, the mark 37 may be formed by printing a bar code on the casing body 3 or adhering a bar code label to the casing body 3. The printing may also be magnetic printing. The mark 37 is read by any suitable reader, such as a code reader, a magnetic reader or the like.

Figure 18:
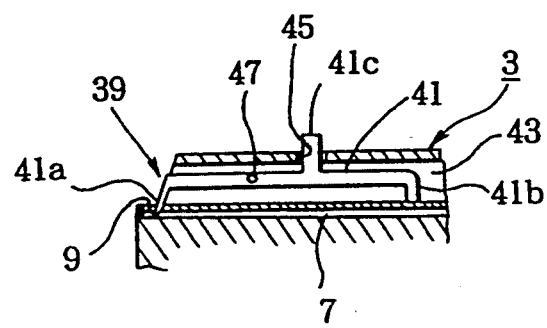
FIG. 18 is a schematic enlarged sectional view of the packaging means having shutter means.

Again referring to FIG. 1, shutter means 39 for closing and opening the outlet 9 of the casing body 3 may be provided at a portion of the casing body 3 which is near the outlet 9. The shutter means 39 is best shown in FIG. 18. The shutter means 39 comprises an elongate body 41 taking the form of a leaf spring. The body 41 of the shutter means 39 has a first piece 41a formed integrally therewith in a manner to project downwardly from one end portion of the shutter body 41, a second piece 41b formed integrally therewith in a manner to project downwardly from the other end portion of the shutter body 41, and a projection 41c formed integrally therewith in a manner to project upwardly from a substantially middle portion of the shutter body 41. The first piece 41a is longer than the second piece 41b. The whole shutter body 41 including the first piece 41a, the second piece 41b and the projection 41c is made of an elastic material such as plastic or stainless steel.

Where this shutter means 39 is employed, an elogate recess 43 is formed in the casing body 3 in a manner to extend along and be disposed on an upper wall of a predetermined portion of the linear passageway 7. Also, a through-hole 45 is formed in an upper wall of the recess 43 of the casing body 3. The shutter body 41 is received in the recess 43 of the casing body 3 with the first piece 41a thereof being inserted at its tip end in the outlet 9 of the casing body 3, with the projection 41c thereof projecting upward from the casing body 3 through the through-hole 45, and with the second piece 41b being in contact with the upper wall of the linear passageway 7. The shutter body 41 is supported at its portion thereof between the first piece 41a and the projection 41c to the casing body 3 through a support pin 47. The tip end of the first piece 41a of the shutter body 41 is usually inserted in the outlet 9 of the casing body 3, to thereby cause the outlet 9 to be closed. As described above, the shutter body 41 is made of an elastic material. Therefore, when the projection 41c of the shutter body 41 is pushed downward as will be discussed in greater detail hereinafter, a portion of the shutter body 41 between the second piece 41b of the shutter body 41 and a portion of the shutter body 41, which is supported to the casing body 3 by the pin 47, is deformed downward, while the first piece 41a of the shutter body 41 is plastically deformed upward and goes out of the outlet 9 of the packaging means 1, resulting in the outlet 9 being opend.

Figure 19:
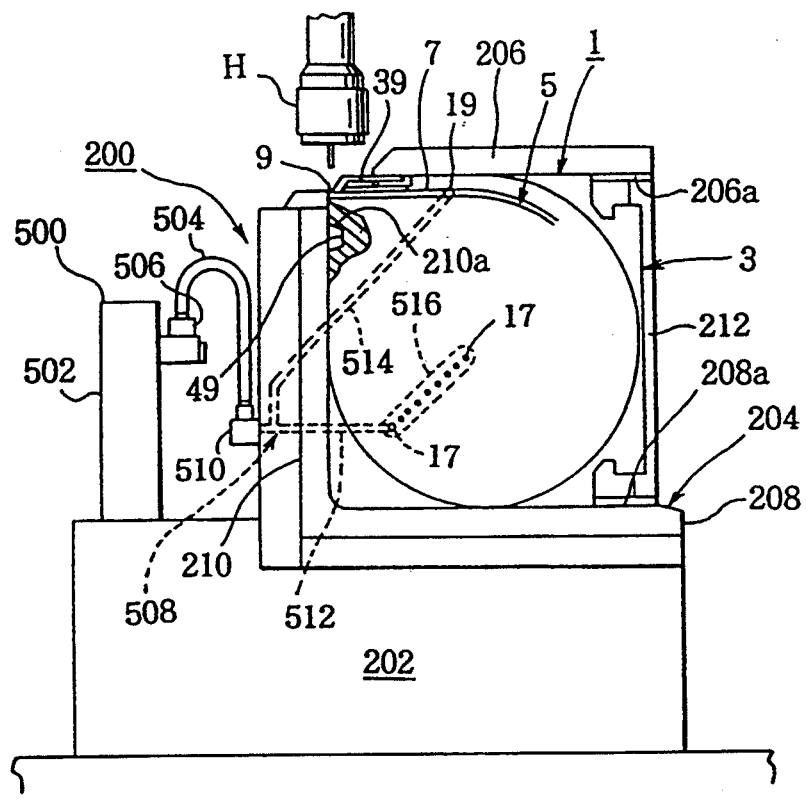
FIG. 19 is a schematic front view of an electronic component supply mechanism.

Referring now to FIG. 19, there is illustrated the electronic component supply mechanism 200. In FIG. 19, the packaging means 1 is supported on the base 202 of the electronic component supply mechanism 200 through a support frame 204. The electronic component supply mechanism 200 includes the base 202, and the support frame 204 of a substantially square shape for causing the packaging means 1 to stand upward from the base 202, which support frame 204 is mounted on the base 202. The support frame 204 comprises an upper section 206, a lower section 208, a left side section 210, and a right side section 212.

The upper section 206 of the support frame 204 has a first linear groove 206a formed in an underside thereof and extending along the total length thereof. Likewise, the lower section 208 has a linear groove 208a formed in a top portion thereof and extending along the total length thereof. Each of the grooves 206a and 208a has a width (measured in the direction perpendicular to the sheet of FIG. 19) slightly more than that of the casing body 3 of the packaging means 1. The upper section 206 has a length less than that of the lower section 208. The left side section 210 extends upward from one end of the lower section 208 but is not connected to the upper section 206. The right side section 212 interconnects the upper section 206 and the lower section 208, and deviates to the direction perpendicular to the sheet of FIG. 19, relative to the left side section 210, to thereby facilitate receiving of the packaging means 1 as will be described later. The left side section 210 has a projection 210a projecting toward the right side section 212. Bearing on this, a recess 49 is formed in a portion of the casing body 3 of the packaging means 1 which positionally corresponds to the projection 210a of the left side section 210 when the packaging means 1 is supported by the support frame 204. The packaging means 1 is adapted to be supplied to the support frame 204 from the right direction of FIG. 19. The supplying of the packaging means 1 to the support frame 204 is carried out by fitting ends of top and lower portions of the casing body 3 into the grooves 206a and 208a of the upper and lower sections 206 and 208, while placing one side of the casing body 3 of the packaging means 1 on the right side section 212 of the support frame 204 which deviates to the direction perpendicular to the sheet of FIG. 19 as described above. Then, the packaging means 1 is moved in the left direction of FIG. 19 along the grooves 206a and 208a of the upper and lower sections 206 and 208, and stopped against the left side section 210. Simultanesouly, the recess 49 of the packaging means 1 is engaged with the projection 210a of the left side section 210. Thus, the packaging means 1 is securely supported by the support frame 204 with the top and lower portions thereof being respectively fitted in the groove 206a of the upper section 206 and the groove 208a of the lower section 208, with the side thereof being held by the left side section 210, and with the recess portion 49 thereof being engaged with the projection 210a of the left side section 210. The upper section 206 of the support frame 204 has a length relatively shorter than that (measured in the lateral direction of FIG. 19) of the casing body 3 of the packaging means 1 and is disconnected with the left side section 210 as described above. Thus, when the packaging means 1 is supported by the support frame 204, the outlet 9 of the packaging means 1 is exposed without being covered by the upper section 206 of the support frame 204.

In the packaging means 1 provided with the shutter means 39 of FIGS. 1 and 18, the projection 41c of the shutter body 41 is projected upwardly from the casing body 3 as described above. Therefore, when the packaging means 1 is supplied to the support frame 204 of the electronic component supply mechanism 200 as described above, the projection 41c of the shutter means 39 is pushed downward by a groove surface of the upper section 206 of the support frame 204. As a result, the outlet 9 of the packaging means 1 is unnecessarily opened. Therefore, in the event that the casing body 3 of the packaging means 1 carries a full load of electronic components, some of the electronic components contained in the casing body 3 will accidentally spill out of the casing body 3 through the unnecessarily opened outlet 9 during the moving of the packaging means 1 in the left direction of FIG. 19. Therefore, where the packaging means 1 having the shutter means 39 of FIG. 18 is employed, it is necessary to think out some device to solve the problem as will be described in greater detail hereinafter.

Figure 20A:
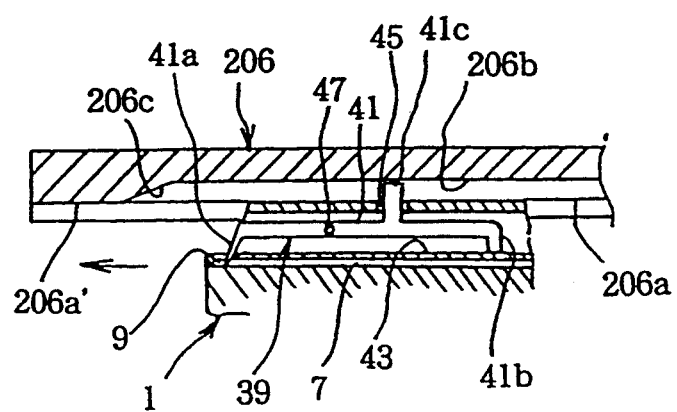
FIGS. 20A and 20B are schematic enlarged fragmentary sectional views of the packaging means having the shutter means of FIG. 18, in which the packaging means is supported by a support frame.
Figure 20B:
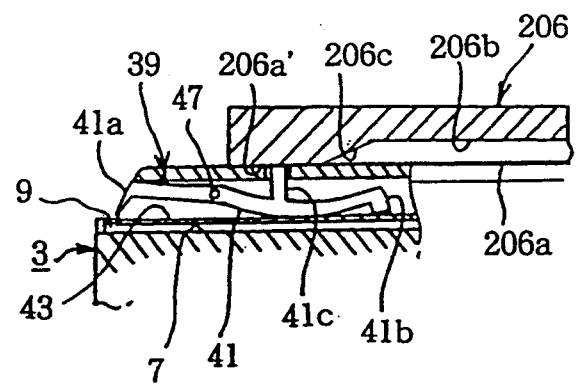

Referring now to FIGS. 20A and 20B, the upper section 206 of the support frame 204 has a second linear groove 206b in addition to the first linear groove 206a. The second linear groove 206b is disposed on the first of groove 206a, communicates with the first linear groove 206a, and extends from a right end of the upper section 206 to a predetermined portion of the upper section 206 along the first linear groove 206a. The second groove 206b of the upper section 206 has a height enough to receive the projection 41c of the shutter means 39, which projects upwardly from the casing body 3 of the packaging means 1, when the packaging means 1 is supplied to the support frame 204. Also, the second linear groove 206b of the upper section 206 has a downward slope 206c descending toward the direction, in which the packaging means 1 is moved along the upper and lower sections 206 and 208 of the support frame 204, from one end of a top wall of the second linear groove 206b. When the packaging means 1 is supplied to the support frame 204 as described above, the projection 41c of the shutter means 39 which projects upwardly from the casing body 3 of the packaging means 1 is received in the second groove 206b of the upper section 206. As the packaging means is moved toward the left side section 210 of the support frame 204 along the upper and lower sections 206 and 208 as described above, the projection 41c of the shutter means 39 is also moved in the second groove 206b of the upper section 206. At this time, the projection 41c of the shutter means 39 is in the second groove 206b and is not yet pressed down, so that the outlet 9 of the casing body 3 has been still closed by the first piece 41a of the shutter means 39. Therefore, any of the electronic components contained in the casing body 3 does not spill out of the casing body 3. By further movement of the packaging means 1 relative to the support frame 204, the projection 41c of the shutter means 39 is abutted against the downward slope 206c of the upper section 206 and then moved along the downward slope 206c of the upper section 206 while being gradually pressed down by the downward slope 206c. Still movement of the packaging means 1 relative to the support frame 204 causes the projection 41c of the shutter means 39 to be shifted from the second groove 206b of the upper section 206 into a leading portion 206a' of the first groove 206a of the upper section 206. At this time, the projection 41c of the shutter means 39 is fully pressed down by a top surface of the leading portion 206a' of the first groove 206a, resulting in the outlet 9 of the casing body 3 being opened as described above. Simultaneously, the packaging means 1 is stopped against the left side section 210 of the support frame 204. As described above, when the packaging means 1 is supplied to the support frame 204, the projection 41c of the shutter means 39 is not pressed down by the upper section 206 at first. Therefore, the supplying of the packaging means 1 to the support frame 204 is carried out while keeping the outlet 9 of the casing body 3 closed. When the packaging means 1 is moved toward the left side section 210 of the support frame 204 along the upper and lower sections 206 and 208, thereby causing the projection 41c of the shutter means 39 to be shifted from the second groove 206b of the upper section 206 of the support frame 204 to the leading portion 206a' of the first groove 206a of the upper section 206, the projection 41c of the shutter means 39 is fully depressed by the leading portion 206a' of the first groove 206a. At this time, the portion of the shutter body 41 between the second piece 41b of the shutter body 41 and the portion of shutter body 41, which is supported to the casing body 3 by the pin 47, is deformed downward, while the first piece 41a of the shutter body 41 is plastically deformed upward and goes out of the outlet 9 of the packaging means 1, resulting in the outlet 9 of the casing body 3 being opened as shown in FIG. 20B. When the electronic components contained in the casing body 3 of the packaging means 1 are all taken out of the casing body 3 through the opened outlet 9 by means of the suction nozzle of the mounting head, resulting in the packaging means 1 being emptied, the emptied packaging means is removed from the support frame 204 in order to be replaced by new packaging means. The removal of the emptied packaging means from the support frame 204 is effected by drawing the emptied packaging means out of the support frame 204 while causing the emptied packaging means to be moved in the right direction of FIG. 19 along the upper and lower sections 206 and 208 of the support frame 204. During the drawing of the emptied packaging means out of the support frame 204, the projection 41c of the shutter means 39 is released from the top surface of the leading portion 206a' of the first groove 206a of the upper section 206 and elastically projects into the second groove 206b of the upper section 206. At this time, the shutter body 41 is restored to its original state because the shutter body 41 is made of an elastic material as described above. Consequently, the outlet 9 of the casing body 3 is again closed by the first piece 41a of the shutter body 41.

Figure 21:
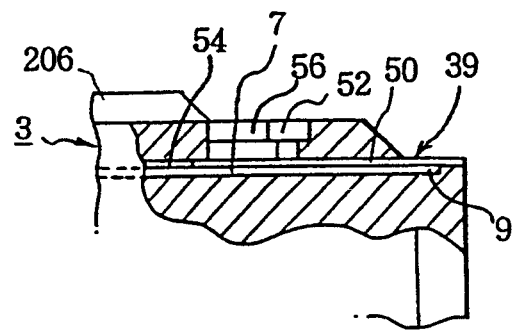
FIG. 21 is a schematic enlarged sectional view of a first modification of the shutter means shown in FIGS. 18, 20A and 20B.

Referring to FIG. 21, there is illustrated a modification of the shutter means 39 shown in FIGS. 18, 20A and 20B. This modification 39 comprises a shielding plate 50 on which a pin 52 is provided. The shielding plate 50 has a width (measured in the direction perpendicular to the sheet of FIG. 21) slightly more than that of the linear passageway 7 of the casing body 3. Where the modification 39 is employed, a linear hole 54 is formed in the casing body 3 in a manner to extend along and be disposed on a predetermined portion of the linear passageway 7. The linear hole 54 communicates with the portion of the linear passageway 7 and has a width (measured in the direction perpendicular to the sheet of FIG. 21) slightly more than that of the linear passageway 7. Also, a vertical through-hole 56 is formed in the casing body 3 in a manner to communicate with the linear hole 54 and disposed on the linear hole 54. The shielding plate 50 is slidably inserted in the linear hole 54 with the pin 52 being received in the through-hole 56. The outlet 9 of the casing body 3 is adapted to be shielded by the shielding plate 50 after electronic components are crammed in the casing body 3. Thus, the electronic components contained in the casing body 3 do not spill out of the casing body 3 during storage and transportation of the packaging means. In FIG. 21, the outlet 9 of the casing body 3 is shielded by the shielding plate 50. When the electronic components contained in the casing body 3 are to be taken out of the casing body 3 by means of the suction nozzle of the mounting head, the outlet 9 of the casing body 3 is opened by causing the shielding plate 50 to slide along the linear hole 54 in the left direction of FIG. 21 while pushing the pin 52 in the same direction.

Figure 22:
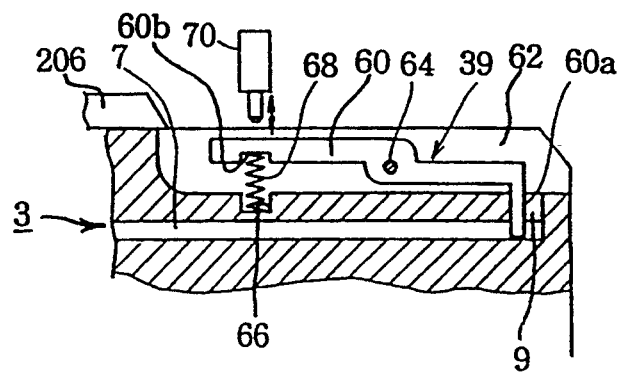
FIG. 22 is a schematic enlarged sectional view of a second modification of the shutter means.

Referring to FIG. 22, there is illustrated another modification of the shutter means 39 shown in FIGS. 18, 20A and 20B. This modification 39 comprises an elongated body 60 received in a recess portion 62 formed in a top portion of the casing body 3 which is near the outlet 9. The elongated body 60 is pivotally connected at its substantially middle portion to the casing body 3 through a support pin 64. Also, the elongated body 60 of the shutter means 39 has a stopper piece 60a provided at one end portion thereof and a recess 60b formed in a portion near the other end portion thereof. The stopper piece 60a hangs downwardly from the one end portion of the elongated body 60. Arranged between the recess 60b of the elongated body 60 and a recess 66 formed in a bottom of the recess portion 62 of the casing body 3 is a compression spring 68. Due to an action of the compression spring 68, the elongated body 60 of the shutter means 39 is always urged in a manner that the stopper piece 60a thereof is projected in the outlet 9 of the casing body 3, thereby causing the outlet 9 to be closed. When the packaging means 1 provided with the shutter means 39 of FIG. 22 is employed, the shutter means 39 is adapted to be actuated by actuating means 70, for example, a solenoid. The solenoid 70 is supported to the base of the electronic component supply mechanism in a manner to be located above the shutter means 39 when the packaging means 1 is supported on the base of the electronic component supply mechanism through the support frame. The solenoid 70 is adapted to be operated synchronously with the intermittent feeding of air into the casing body 3 of the packaging means 1 by the air supply source. When the solenoid 70 is operated, a pin of the solenoid 70 pushes the other end portion of the elongated body 60 downward to cause the elongated body 60 of the shutter means 39 to be rotated about the support pin 64 against the action of the compression spring 68, to thereby cause the stopper piece 60a of the shutter means 39 to go out of the outlet 9. Thus, the outlet 9 of the packaging means 1 is opened.

As will be discussed in greater detail hereinafter, the packaging means 1 may be automatically supplied to the support frame 204 and automatically removed from the support frame 204.

Referring now to FIGS. 23A and 23B, a pair of spaced apart recesses 73 and 75 are formed in the casing body 3 of the packaging means 1. The spaced apart recesses 73 and 75 are respectively formed in a top portion of the casing body 3 and a lower portion of the casing body 3. The supplying of the packaging means 1 to the support frame 204 of the electronic component supply mechanism and removal of the packaging means 1 from the support frame 204 are automatically carried out by any suitable conventional auto-changer means. The auto-changer means includes a pair of chucking pawls 300 and 302. When the packaging means 1 is to be supplied to the support frame 204 or removed from the support frame 204, the chucking pawls 300 and 302 of the atuo-changer means are adapted to be actuated so as to be respectively engaged with the spaced apart recesses 73 and 75 of the packaging means 1. In FIG. 23A, each of the spaced apart recesses 73 and 75 of the packaging means 1 is formed into a substantially U-shape. Bearing on this, a tip end of each of the pawls 300 and 302 of the auto-changer means is formed into a shape which matches with that of each of the spaced apart recesses 73 and 75. As shown in FIG. 23B, each of the spaced apart recesses 73 and 75 may be formed into a substantially V-shape. In this case, the tip end of each of the pawls 300 and 302 is pointed. The auto-changer means is adapted to be moved between the support frame 204 and a position, at which a magazine (not shown) for receiving a plurality of electronic component packaging means is arranged, by any suitable conventional driving means (not shown). When electronic component packaging means 1 is to be supplied to the support frame 204, the pawls 300 and 302 of the auto-changer means are actuated so as to be respectively engaged with the spaced apart recesses 73 and 75 of one of the electronic component packaging means received in the none-shown magazine and clamp the packaging means. Then, the auto-changer means having the electronic component packaging means clamped by the pawls 300 and 302 thereof is moved toward the support frame 204 and supplies the electronic component packaging means to the support frame 204. After the packaging means is supplied to the support frame 204, the pawls 300 and 302 of the auto-changer means are actuated in a manner to release the packaging means therefrom. When the electronic components contained in the casing body 3 of the packaging means 1 supported by the support frame 204 are all taken out of the casing body 3 by means of the suction nozzle of the mounting head, resulting in the casing body 3 of the packaging means 1 being emptied, the pawls 300 and 302 of the auto-changer means are actuated so as to be respectively engaged with the spaced apart recesses 73 and 75 of the emptied casing body and clamp the emptied casing body. The auto-changer means having the emptied casing body 3 clamped by the pawls 300 and 302 thereof is then moved toward the none-shown magazine while drawing the casing body from the support frame 204, and returns the emptied casing body to the magazine. Then, new packaging means is supplied to the support frame 204 from the magazine by the auto-changer means in the same manner as described above.

In addition to the support frame 204, positioning means for positioning the packaging means 1 with respect to the support frame 204 may be employed. As shown in FIG. 24, the positioning means 400 includes a positioning pin 402 which is adapted to be actuated by any suitable actuating means 404, for example, a solenoid or a drive cylinder. Where the positioning means 400 is employed, a receiving recess 77 is formed at a substantially central portion of the casing body 3 of the packaging means. The positioning pin 402 is adapted to be moved laterally with respect to the support frame 204 by the actuating means 404. When the packaging means is supported by the support frame 204, the positioning pin 402 is moved toward the packaging means by the actuating means 404 and engaged with the receiving recess 77 of the packaging means. Thus, the packaging means is securely positioned with respect to the support frame 204 by the positioning pin 402. Also, when the packaging means is to be removed from the support frame 204, the positioning pin 402 is moved away from the packaging means by the actuating means 404. Thus, the packaging means is released from the positioning pin 402.

Figure 25:
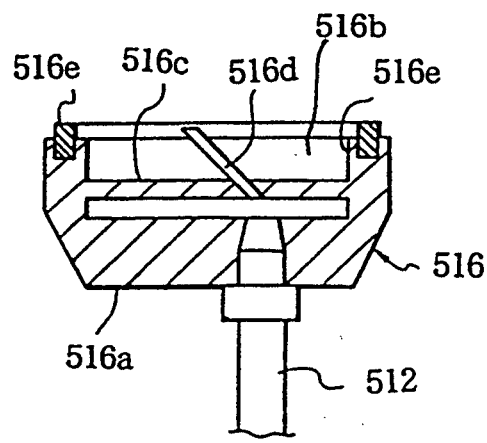
FIG. 25 is a schematic enlarged sectional view of a coupling.

Again referring to FIG. 19, the electronic component supply mechanism 200 includes an air supply source 500 for intermittently feeding air. The air supply source 500 includes an air valve 502 mounted on the base 202. The air valve 502 is connected to one end of a substantially U-shaped connecting pipe 504 through a first joint 506. The other end of the connecting pipe 504 is connected to a branched pipe 508 through a second joint 510. The branched pipe 508 has a first pipe portion 512 and a second pipe portion 514. The first pipe portion 512 of the branched pipe 508 is provided at its tip end with the coupling 516 which is adapted to be fitted in the frame portion 20 (see FIG. 2) surrounding the air-intakes 17 of the casing body 3 as briefly described above. A tip end of the second pipe portion 514 of the branched pipe 508 is adapted to be connected to the auxiliary air-intake 19 of the casing body 3 when the packaging means 1 is supported by the support frame 204. An air-nozzle (not shown) may be provided at the tip end of the second pipe portion 514. When the packaging means 1 is supported by the support frame 204, the air-nozzle is fitted in the auxiliary air-intake 19. As shown in FIG. 25, the coupling 516 comprises a body 516a of a substantially cup-shape. The body 516a has an opening 516b of a size sufficient to surround the air-intakes 17 of the casing body 3 when the coupling 516 is fitted in the frame portion 23. Also, the body 516a is provided in the interior thereof with a partition wall 516c for dividing the interior into the opening side 516b and a side connected to the first pipe portion 512 of the branched pipe 508. The partition wall 516c is provided with a plurality of air-nozzles 516d (only one is shown in FIG. 25) communicating with the side of the coupling body 516a which is connected to the first pipe portion 512 of the branched pipe 508. The air-nozzles 516d correspond in number to the air-intakes 17. Each of the air-nozzles 516d is inclined. When the packaging means 1 is supported by the support frame 204, the coupling 516 is fitted in the frame portion 23 of the packaging means 1 in a manner that each of the air-nozzles 516d is fitted in the corresponding one of the air-intakes 17 of the casing body 3. In order to provide airtightness, a rubber ring 516e of a substantially O-shape may be mounted in the opening side of the coupling 516. The coupling 516 may be connected to any suitable drive means (not shown). When the packaging means is supported by the support frame 204, the coupling 516 is moved toward the frame portion 23 of the packaging means 1 by the none-shown drive means to be automatically fitted in the frame portion 23. Also, when the packaging means becomes emptied and is to be removed from the support frame 204, the coupling 516 is moved away from the frame portion 23 by the drive means, whereby the coupling 516 is automatically released from the frame portion 23 of the packaging means. The first pipe portion 512 of the branched pipe 508 is provided with a first switching valve (not shown) for closing and opening the first pipe portion 512. Likewise, the second pipe portion 514 of the branched pipe 508 is provided with a second switching valve (not shown) for closing and opening the second pipe portion 514.

As described above, the electronic components contained in the spiral passageway 5 of the casing body 3 are moved along the passageways 5 and 7 toward the outlet 9, which is located at the upper portion of the casing body 3 standing on the base 202 of the electronic component supply mechanism 200, by air fed into the passageways 5 and 7 through the air-intakes 17 and 19 of the casing body 3 from the air supply source 500. The electronic components are moved towar the outlet while colliding with one another. Also, when the supplying of air into the casing body 3 by the air supply source is stopped, electronic components which do not yet arrive at the linear passageway 7 move by gravity along the respective circular portions of the spiral passageway 5 toward the innermost circular portion 5b of the spiral passageway 5 while colliding with one another. Repeated collision of the electronic components with one another, which will be brought about by the intermittent feeding of air into the casing body 3, may result in the electronic components being damaged and/or may result in characteristics of the electronic components deteriorating.

This problem will be alleviated by detecting electronic components, which arrive at the linear passageway 7, and controlling the supplying of air in a manner to reduce the number of the collisions of electronic components with one another. In addition to this, if the electronic components which arrive at the linear passageway 7 can be detected, it will also be capable of grasping the time when packaging means 1 becomes empty. This will facilitate rapid replacing of emptied packaging means with new packaging means.

In view of the above, detecting means for detecting the electronic components contained in the casing body 3 may be employed as will be described in detail hereinafter.

Figure 26:
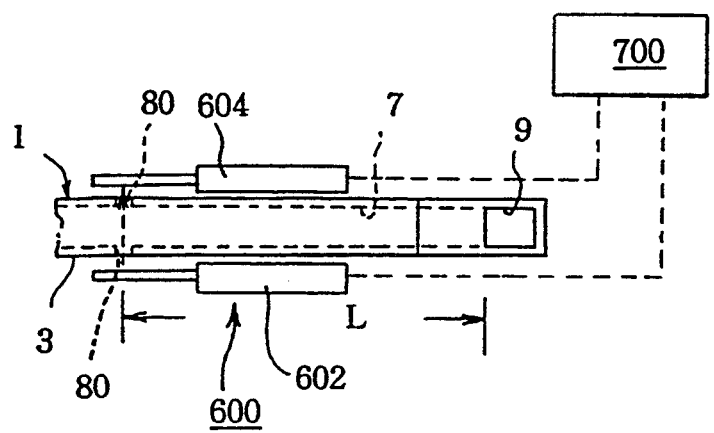
FIG. 26 is a schematic plan view of detecting means for detecting electronic components contained in the casing body.

Referring to FIG. 26, there is illustrated detecting means 600 for detecting electronic components contained in the casing body 3. Where this detecting means 600 is employed, a through-hole 80 is formed in the casing body 3 in a manner to traverse a portion of the linear passageway 7 of the casing body 3 which is spaced at a predetermined distance L away from the outlet 9 and is a portion between the outlet 9 and the auxiliary air-intake 19. The predetermined distance varies from a length of one electronic component to a length of one electronic component, but substantially corresponds to the total length of a few electronic components, for example, about four or five electronic components. Also, the diameter of the through-hole 80 varies from the size of an electronic component to the size of an electronic component, but is smaller than the size of an electronic component. The detecting means 600 includes light-emitting means 602 for emitting light, and light-receiving means 604, for example, a light sensor for receiving light emitted from the light-emitting means 602. The light-emitting means 602 and the light-receiving means 604 are supported to the base 202 of the electronic component supply mechanism 200 by any suitable support means and arranged in a manner to interpose the packaging means 1 therebetween when the packaging means 1 is supported by the support frame 204. A light-emitting section 602' of the light-emitting means 602 and a light-receiving section 604' of the light-receiving means 604 are aligned with each other. Also, the through-hole 80, when the packaging means 1 is supported by the support frame 204, is adapted not to be covered by the upper section 206 of the support frame 204 since the length of the upper section 206 is shorter than that of the packaging means as described above, and is adapted to be aligned with the light-emitting section 602' and the light-receiving section 604', whereby light emitted from the light-emitting section 602' can pass through the through-hole 80 to the light-receiving section 604'. The light-emitting means 602 and the light-receiving means 604 are electrically connected to controlling means 700. While the light-receiving section 604' continues receiving light emitted from the light-emitting section 602', the light-receiving means 604 is adapted to continue sending a signal to the controlling means 700. More particularly, the controlling means 700 generally includes a first section (not shown) electrically connected through a switch (not shown) to the light-emitting means 602, and a second section (not shown) electrically connected to the first switching valve for the first pipe portion 512 of the branched pipe 508 (see FIG. 19) and the second switching valve for the second pipe portion 514 of the branched pipe 508. The light-emitting means 602 is usually switched on, whereby light is adapted to be emitted from the light-emitting section 602'. While the control means 700 continues receiving the signal from the light-receiving means 604, the second section of the controlling means 700 is adapted to continue sending signals to the first switching valve for the first pipe portion 512 of the branched pipe 508 and the second switching valve for the second pipe portion 514 of the branched pipe 508. Also, while the first and second switching valves continues receiving the signals from the second section of the controlling means 700, the first pipe portion 512 is adapted to be kept opened by the first switching valve and the second pipe portion 514 is adapted to be kept closed by the second switching valve according to the signals. Conversely, when the sending of the signals to the first and second switching valves from the second section of the controlling means 700 is stopped, the first switching valve is adapted to automatically close the first pipe portion 512 and the second switching valve is adapted to automatically open the second pipe portion 514. In condition where the second section of the controlling means 700 continues sending the signals to the first and second switching valves, whereby the first pipe portion 512 is opened by the first switching valve and the second pipe portion 514 is closed by the second switching valve, air supplied from the air supply source 500 flows into the first pipe portion 512 of the branched pipe 508 and jets from the main air-intakes 17 of the casing body 3 toward the electronic components received in the spiral passageway 5 of the casing body 3. By the feeding of air into the casing body 3 through the main air-intakes 17, the electronic components contained in the casing body 3 are moved toward the linear passageway 7 along the spiral passageway 5 of the casing body 3 and some of the electronic components then arrive at the linear passageway 7. After once air is supplied to the casing body 3 through the main air-intakes 17, electronic components which do not arrive at the linear passageway 7 are moved toward the innermost circular portion 5b of the spiral passageway 5 by gravity. When some electronic components arrive at the linear passageway 7 due to the feeding of air into the casing body 3 through the main air-intakes 17 and foremost one of the electronic components arriving at the linear passageway 7 passes by the through-hole 80, light emitted from the light-emitting section 602' is blocked by the electronic component and does not reach the light-receiving section 604', resulting in a condition in which the signal is not sent to the controlling means 700 from the light-receiving means 604. When the sending of the signal to the controlling means 700 from the light-receiving means 604 is stopped, the second section of the controlling means 700 does not send the signals to the first switching valve for the first pipe portion 512 of the branched pipe 508 and the second switching valve for the second pipe portion 514 of the branched pipe 508. As a result, the first pipe portion 512 is automatically closed by the first switching valve and the second pipe portion 514 is automatically opened by the second switching valve as described above. Thus, air intermittently fed from the air supply source 500 flows toward the second pipe portion 514 of the branched pipe 508, passes through the second pipe portion 514, and jets from the auxiliary air-intake 19 toward the electronic components residing in the linear passageway 7. By the intermittent feeding of air into the linear passageway 7 through the auxiliary air-intake 19, the electronic components, which reside in the linear passageway 7, in turn are moved toward the outlet 9 along the linear passageway 7. When the foremost one of the electronic components arrives at the outlet 9, the mounting head H (see FIG. 19) waiting at a position above the outlet 9 is moved downward with respect to the outlet 9 to hold the foremost electronic component through its suction nozzle and takes the electronic component out of the casing body 3 while moving upward. Then, the mounting head H is moved toward a printed circuit board carried on any suitable carrying means and mounts the electronic component on the printed circuit board. Thereafter, the mounting head H returns to the position above the outlet 9 of the casing body 3 and is again moved downward with respect to the outlet 9 in order to take a next electronic component out of the casing body 3. The intermittentfeeding of air into the linear passageway 7 through the auxiliary air-intake 19 is adapted to be carried out each time the mounting head H takes an electronic component out of the casing body 3. Therefore, when the mounting head H mounts an electronic component on a printed circuit board and returns to the position above the outlet 9 of the casing body 3, a next electronic component has already arrived at the outlet 9 of the casing body 3. Thus, the electronic components residing in the linear passageway 7 are taken out of the casing body 3 one by one by means of the mounting head H. When the electronic components residing in the linear passageway 7 are moved toward the outlet 9 by the intermittent feeding of air into the linear passageway 7 through the auxiliary air-intake 19 and backmost one of the electronic components passes by the through-hole 80, resulting in a condition in which there are no electronic components which block the passage of light emitted from the light-emitting section 602', light emitted from the light-emittingsection 602' again passes through the through-holes 80 of the casing body 3 to the light-receiving section 604'. At this time, the signal is again sent to the controlling means 700 from the light-receiving means 604. Then, the second section of the controlling means 700 again sends the signals to the first switching valve for the first pipe portion 512 of the branched pipe 508 and the second switching valve for the second pipe portion 514 of the branched pipe 508. According to the signals, the first pipe portion 512 is opened by the first switching valve and the second pipe portion 514 is closed by the second switching valve. Thus, air supplied from the air supply source 500 flows toward the first pipe portion 512 of the brandched pipe 508, passes through the first pipe portion 512 of the branched pipe 508 and jets through the main air-intakes 17 into the spiral passageway 5 of the casing body 3. By the feeding of air into the spiral passageway 5 through the main air-intakes 17, electronic components remaining in the spiral passageway 5 are moved toward the linear passageway 7 along the spiral passgeway 5. Then, foremost one of the electronic components blocks the passage of light emitted from the light-emitting section 602', resulting in a condition in which the signal is not sent to the controlling means 700 from the light-receiving means 604. Simultaneously, the sending of the signals to the first and second switching valves from the second section of the controlling means 700 is stopped, whereby the first pipe portion 512 of the branched pipe 508 is automatically closed by the first switching valve and the second pipe portion 514 of the branched 508 is automatically opened by the second switching valve. Thus, air supplied from the air supply source 500 flows toward the second pipe portion 514 of the branched pipe 508, passes through the second pipe portion 514 of the branched pipe 508 and jets from the auxiliary air-intake 19 into the linear passgeway 7 of the casing body 3, whereby electronic components arriving at the linear passageway 7 are moved to the outlet 9. The above-described operations are repeatedly carried out. Then, when all remaining electronic components in the casing body 3 arrive at the linear passageway 7 due to the feeding of air into the spiral passageway through the main air-intakes 17 and backmost one of the remaining electronic components passes by the through-hole 80 due to the feeding of air into the linear passageway 7 through the auxiliary air-intake 19, light emitted from the light-emitting section 602' again reaches the light-receiving section 604' and the second pipe portion 514 connected to the auxiliary air-intake 19 is closed by the second switching valve as described above, so that air from the air supply source 500 does not flow into the linear passageway 7 through the auxiliary air-intake 19. Therefore, a few electronic components including the backmost electronic component are not moved toward the outlet 9 and remain in a portion of the linear passageway 7 between the outlet 9 and the portion of the linear passageway in which the through-hole 80 is formed, because the predetermined distance L between the through-hole 80 and the outlet 9 corresponds to the total length of a few electronic components as described above. In this condition, air from the air supply source 500 flows into the spiral passageway 5 through the main air-intakes 17. At this time, the backmost electronic component has already passed by the through-hole 80, so that even though the intermittent feeding of air into the spiral passageway 5 through the main air-intakes 17 is carried out, the passage of light emitted from the light-emitting section 602' is not blocked. Where a condition, in which light emitted from the light-emitting section 602' is not blocked, is kept for a predetermined time even though the intermittent feeding of air into the spiral passageway 5 through the main air-intakes 17 is carried out, the first section of the controlling means 700 is adapted to cause the light-emitting means 602 to be switched off. When the light-emitting means 602 is switched off, light is not emitted from the light-emitting section 602', the sending of the signal from the light-receiving means 604 to the controlling means 700 is stopped and the sending of the signals from the second section of the controlling means 700 to the first and second switching valves is stopped. As a result, the first pipe portion 512 connected to the main air-intakes 17 is automatically closed by the first switching valve and the second pipe portion 514 connected to the auxiliary air-intake 19 is automatically opened by the second switching valve. Thus, the intermittent feeding of air into the linear passageway 7 through the auxiliary air-intake 19 is carried out, whereby the remaining electronic components in turn are moved to the outlet 9 and are all taken out of the casing body 3 by the mounting head H. As described above, the predetermined distance L between the outlet 9 and the through-hole 80 corresponds to the total length of a few electronic components. The intermittent feeding of air into the linear passageway 7 through the auxiliary air-intake 19, which is carried out after the light-emitting means 602 is switched off, is adapted to be performed predetermined times which correspond to the number of a few electronic components remaining in the portion of the linear passageway 7 between the outlet 9 and the through-hole 80. More particularly, where the predetermined distance L corresponds to the total length of, e.g., four electronic components, the intermittent feeding of air into the linear passageway 7 through the auxiliary air-intake 19, which is carried out after the light-emitting means 602 is switched off, is adapted to be performed four times. Thus, the remaining electronic components are all moved to the outlet 9 by the intermittent feeding of air into the linear passageway 7 through the auxiliary air-intake 19 and taken out of the casing body 3 by the mounting head H, resulting in the casing body 3 becoming empty. When the intermittent feeding of air into the linear passageway 7, which is performed after the light-emitting means 602 is switched off, is carried out the predetermined times, an indicator light (not shown) electrically connected to the controlling means 700 is adapted to wink, thereby telling an operator that the electronic component packaging means becomes empty. Thus, the operator can replace the emptied packaging means with new packaging means. Instead of the indicator light, an alarm unit may be employed. Also, where the auto-changer means briefly discussed above is employed, the auto-changer means may be electrically connected to the controlling means 700. In this case, when packaging means becomes empty, the controlling means 700 is adapted to send a command to the auto-changer means. According to the command, the auto-changer means automatically replaces the emptied packaging means with new packaging means.

In a case where the detecting means 600 shown in Fig. 26 is employed, after electronic components arriving at the linear passageway 7 are moved toward the outlet 9, electronic components remaining in the spiral passageway 5 are moved toward the linear passageway 7. Therefore, the electronic components which have arrived at the linear passageway 7 do not collide with the remaining electronic components. Thus, the number of collision of electronic components with one another will be reduced. More particularly, in a case where the linear passageway 7 has a length enough to receive, for example, twenty electronic components, only when twenty electronic components having been transferred to the linear papaageway 7 by air fed through the main air-intakes 17 into the spiral passageway 5 are moved toward the outlet 9 and backmost one of the electronic components passes by the through-holes 80 of the casing body due to the feeding of air into the casing body 3 through the auxiliary air-intake 19, electronic components remaining in the spiral passageway 5 are moved toward the outlet 9 by air again supplied into the spiral passageway 5 through the main air-intakes 17. Therefore, the number of the movements of electronic components toward the outlet 9 and the innermost circular portion 5b of the spiral passageway 5 can be reduced by using the detecting means 600.

As described above, the electronic component packaging means according to the present invention permits the mounting head to directly take electronic components out of the casing body of the packaging means. Also, the electronic component packaging means according to the present invention can permit the mounting head to carry out the predetermined operation at a position above the electronic component packaging means standing on the base of the electronic component supply mechanism, so that the movement of the mounting head is not interfered with the packaging means. In addition, the packaging means can be used as an electronic component supply source without causing the arranging position of carrying means, on which carrying means a printed circuit board is carried, to be restricted, because the mounting head can carry out the predetermined operation at the position above the packaging means.

What is claimed is:

1. Electronic component packaging means for packing electronic components for storage and transportation as well as for supplying electronic components to a mounting head of an automatic electronic component mounting apparatus, said packaging means comprising:
   a substantially plate-like casing body having a substantially spiral passageway formed in its interior, a linear passageway formed therein as a continuation of an outermost circular portion of said spiral passageway, and an outlet formed therein as a continuation of said linear passageway to communicate with the exterior of said body;
   a plurality of electronic components received in a row in said spiral passageway of said casing body; and
   means for facilitating forwarding of said electronic components along said spiral passageway to said outlet;
   said means for facilitating forwarding of said electronic components comprising a plurality of main air-intakes, said air-intakes being formed in said casing body in a manner to communicate between respective circular portions of said spiral passageway and the exterior of said casing body and being adapted to be connected to an air supply source when said packaging means is used as an electronic component supply source;
   said packaging means being adapted to be supported on a base of an electronic component supply mechanism with said plate-like casing body standing on said base when said packaging means is used as said electronic component supply source;
   said outlet and said linear passageway being formed at a portion of said plate-like casing body which is located at an upper position when said packaging means is supported on said base, said outlet being faced upward, above which outlet said mounting head is adapted to wait.

2. Electronic component packaging means as defined in claim 1, wherein said casing body is formed of material which can prevent generation of static electricity between said electronic components and said passageways.

3. Electronic component packaging means as defined in claim 2, wherein said material consists essentially of a mixture of synthetic resin with antistatic powder such as carbon powder or other metal powders.

4. Electronic component packaging means as defined in claim 2, wherein said material is metal material selected from the group consisting of aluminum, iron and copper which can prevent generation of static electricity.

5. Electronic component packaging means as defined in claim 1, wherein said casing body comprises a base plate portion and a cover plate portion, wherein said spiral passageway is a spiral groove and said linear passageway is a linear groove, said spiral groove and said linear groove being formed in one surface side of said base plate portion, said cover plate portion being arranged on a grooved surface of said base plate portion, and wherein said outlet is formed in said base plate portion as a continuation of said linear groove.

6. Electronic component packaging means as defined in claim 5, wherein at least said base plate portion is made of material which can prevent generation of static electricity between said electronic components and said grooves.

7. Electronic component packaging means as defined in claim 6, wherein said material consists essentially of a mixture of synthetic resin with antistatic powder such as carbon powder or other metal powders.

8. Electronic component packaging means as defined in claim 7, wherein said base plate portion and said cover plate portion are bonded together by high-frequency bonding.

9. Electronic component packaging means as defined in claim 6, wherein said material is metal material selected from the group consisting of aluminum, iron and copper which can prevent generation of static electricity.

10. Electronic component packaging means as defined in claim 9, wherein said base plate portion and said cover plate portion are bonded together by high-frequency bonding.

11. Electronic component packaging means as defined in claim 6, wherein said base plate portion and said cover plate portion are bonded together by high-frequency bonding.

12. Electronic component packaging means as defined in claim 5, wherein said electronic component supply mechanism includes positioning means for positioning said packaging means, said positioning means comprising a positioning pin, and wherein said base plate portion has a receiving recess formed at its central portion, said receiving recess being adapted to receive said positioning pin when said packaging means is supported on said base.

13. Electronic component packaging means as defined in claim 5, wherein an assembly of said base plate portion and said cover plate is made of plastic material and has a cutout formed by cutting away said outlet portion and a metal cap having a substantially U-shaped body, said body of said metal cap comprising a pair of spaced apart sections and an intermediate section interconnecting said spaced apart sections, said metal cap being fitted in said cutout with an internal space thereof being aligned with said linear groove, whereby said metal cap constitutes said outlet.

14. Electronic component packaging means as defined in claim 13, wherein said metal cap has a base section integrally formed an underside of said U-shaped body thereof.

15. Electronic component packaging means as defined in claim 13, wherein said spaced apart sections of said metal cap have engaging arms extending linearly from respective free ends thereof, said engaging arms being enegaged with outer surfaces of an assembly of said cover plate portion and said base plate portion, when said metal cap is fitted in said cutout for assembly.

16. Electronic component packaging means as defined in claim 5, wherein said cover plate portion has an identifying mark applied onto the other surface thereof, said identifying mark having data on the kind of electronic component contained in said casing body, parts number, manufacturing date and the like, said data being previously recorded on said mark.

17. Electronic component packaging means as defined in claim 16, wherein said mark is a magnetic mark which can be magnetically read.

18. Electronic component packaging means as defined in claim 17, wherein said mark is formed by a bar code.

19. Electronic component packaging means as defined in claim 16, wherein said mark is formed by a bar code.

20. Electronic component packaging means as defined in claim 3, wherein said electronic component supply mechanism includes auto-changer means for automatically supplying said packaging means onto said base of said electronic component supply mechanism and automatically removing said packaging means from said base, said auto-changer means including a pair of chucking pawls, and wherein an assembly of said cover plate portion and said base plate portion has a pair of spaced apart recesses formed therein, said chucking pawls being adapted to be engaged with said spaced apart recesses when said packaging means is to be supplied onto and removed from said base of said electronic component supply mechanism.

21. Electronic component packaging means as defined in claim 5, further including shutter means for opening said outlet synchronously with the forwarding of said electronic components.

22. Electronic component packaging means as defined in claim 21, wherein said base plate portion has a first recess formed in a portion thereof which is located at an upper position, when said electronic component packaging means is supported on said base, and is near said outlet, and a second recess formed in a bottom of said first recess, and wherein said shutter means includes an elongated body received in said first recess of said base plate portion and a compression spring, said elongated body having a stopper piece extending downwardly from one end portion thereof and a recess formed in a portion near the other end portion thereof, said elongated body being pivotally connected at its substantially middle portion to said base plate portion through a support pin, said compression spring being arranged between said recess of said elongated body and said second recess of said base plate portion, due to an action of which compression spring said elongated body is always urged in a manner that said stopper piece thereof is projected in said outlet, whereby said outlet is closed by said stopper piece.

23. Electronic component packaging means as defined in claim 5, wherein said casing body has a linear hole extending along a predetermined portion of said linear groove to communicate the exterior of said casing body and disposed on the predetermined portion of said linear groove, a vertical through-hole being disposed on said linear hole to communicate between said linear hole and the exterior of said casing body, and shutter means for opening and closing said outlet, said shutter means comprising a shielding plate for shielding said outlet, said shielding plate having a pin provided thereon and being slidably inserted in said linear hole with said pin thereof being received in said vertical through-hole.

24. Electronic component packaging means as defined in claim 5, wherein said base plate portion has an auxiliary air-intake formed at an initial end portion of said linear groove to communicate between said linear groove and the exterior of said casing body.

25. Electronic component packaging means as defined in claim 5, wherein each of said main air-intakes takes the form of a through-hole, said through-hole including a first surface constituting a rear surface relative to the electronic component forwarding direction, a second surface constituting a front surface relative to the electronic component forwarding direction, a first opening near said spiral groove, and a second opening near the other surface of said base plate portion, said rear surface constituting a first slope obliquely ascending from the other surface of said base plate portion toward the electronic component forwarding direction, said front surface constituting a second slope steeper than said first slope or being at right angles to a horizontal plane of said base plate portion, said first opening having a size smaller than that of each of said electronic components, said second opening being relatively large, whereby said through-hole becomes narrow as it extends from the other surface to said spiral groove.

26. Electronic component packaging means as defined in claim 25, wherein said second slope has an air-guide fin formed thereon in a manner to obliquely extend from said first opening toward said first slope.

27. Electronic component packaging means as defined in claim 25, wherein said through-hole has a plate-like piece fixedly fitted therein, said plate-like piece including a slope, said plate-like piece being fitted in said through-hole in a manner that said slope thereof is opposed to said first slope of said through-hole, whereby a slit is provided between said slope of said plate-like piece and said first slope of said through-hole.

28. Electronic component packaging means as defined in claim 27, wherein each of said slope of said plate-like piece and said first slope of said through-hole is curved, whereby said slit is curved.

29. Electronic component packaging means as defined in claim 5, wherein each of said main air-intakes takes the form of a through-hole, said through-hole including a first surface constituting a rear surface relative to the electronic component forwarding direction, a second surface constituting a front surface relative to the electronic component forwarding direction, a first opening near said spiral groove, and a second opening near the other surface of said base plate portion, said first and second surfaces obliquely extending in the electronic component forwarding direction, said first surface constituting a first slope having an angle of about 30° to a horizontal plane of said base plate portion, said second surface constituting a second slope having an angle of about 30° to the horizontal plane of said base plate portion, an end of said first slope which is near said first opening being aligned with an end of said second slope, which is near said second opening, on a vertical line to the horizontal plane of said base plate portion.

30. Electronic component packaging means as defined in claim 1, wherein said electronic component supply mechanism includes positioning means for positioning said packaging means, said positioning means comprising a positioning pin, and wherein said casing body has a receiving recess formed at its central portion, said receiving recess being adapted to receive said positioning pin when said packaging means is supported on said base.

31. Electronic component packaging means as defined in claim 1, wherein said casing body is made of plastic material and has a cutout formed by cutting away said outlet portion and a metal cap having a substantially U-shaped body, said body of said metal cap comprising a pair of spaced apart sections and an intermediate section interconnecting said spaced apart sections, said metal cap being fitted in said cutout with an internal space thereof being aligned with said linear passageway, whereby said metal cap constitutes said outlet.

32. Electronic component packaging means as defined in claim 31, wherein said metal cap has a base section integrally formed an underside of said U-shaped body thereof.

33. Electronic component packaging means as defined in claim 31, wherein said spaced apart sections of said metal cap have engaging arms extending linearly from respective free ends thereof, said engaging arms being engaged with outer surfaces of said casing body when said metal cap is fitted in said cutout for assembly.

34. Electronic component packaging means as defined in claim 1, wherein said casing body has an identifying mark applied said first slope of said through-hole is curved, whereby said slit is curved.

35. Electronic component packaging means as defined in claim 34, wherein said mark is a magnetic mark which can be magnetically read.

36. Electronic component packaging means as defined in claim 34, wherein said mark is formed by a bar code.

37. Electronic component packaging means as defined in claim 35, wherein said mark is formed by a bar code.

38. Electronic component packaging means as defined in claim 1, wherein said electronic component supply mechanism includes auto-changer means for automatically supply said packaging means onto said base of said electronic component supply mechanism and automatically removing said packaging means from said base, said auto-changer means including a pair of chucking pawls, and wherein said casing body has a pair of spaced apart recesses formed therein, said chucking pawls being adapted to be engaged with said spaced apart recesses when said packaging means is to be supplied onto and removed from said base of said electronic component supply mechanism.

39. Electronic component packaging means as defined in claim 1, further including shutter means for opening said outlet synchronously with the forwarding of said electronic components.

40. Electronic component packaging means as defined in claim 39, wherein said casing body has a first recess formed in a portion thereof which is located at an upper portion, when said electronic component packaging means is supported on said base, and is near said outlet, and a second recess formed in a bottom of said first recess, and wherein said shutter means includes an elongated body received in said first recess of said casing body and a compression spring, said elongated body having a stopper piece extending downwardly from one end portion thereof and a recess formed in a portion near the other end portion thereof, said elongated body being pivotally connected at its substantially middle portion to said casing body through a support pin, said compression spring being arranged between said recess of said elongated body and said second recess of said casing body, due to an action of which compression spring said elongated body is always urged in a manner that said stopper piece thereof is projected in said outlet, whereby said outlet is closed by said stopper piece.

41. Electronic component packaging means as defined in claim 1, wherein said casing body has a linear hole extending along a predetermined portion of said linear passageway to communicate the exterior of said casing body and disposed on the predetermined portion of said linear passageway, a vertical through-hole being disposed on said linear hole to communicate between said linear hole and the exterior of said casing body, and shutter means for opening and closing said outlet, said shutter means comprising a shielding plate for shielding said outlet, said shielding plate having a pin provided thereon and being slidably inserted in said linear hole with said pin thereof being received in said vertical through-hole.

42. Electronic component packaging means as defined in claim 1, wherein said casing body has an auxiliary air-intake formed at an initial end portion of said linear passageway to communicate between said linear passageway and the exterior of said casing body.

43. Electronic component packaging means as defined in claim 1, wherein each of said main air-intakes takes the form of a through-hole, said through-hole including a first surface constituting a rear surface relative to the electronic component forwarding direction, a second surface constituting a front surface relative to the electronic component forwarding direction, a first opening near said spiral passageway, and a second opening rear a back side surface of said casing body, said rear surface constituting a first slope obliquely ascending from said back side of said casing body toward the electronic component forwarding direction, said front surface constituting a second slope steeper than said first slope or being at right angles to a horizontal plane of said casing body, said first opening having a size smaller than that of each of said electronic components, said second opening being relatively large, whereby said through-hole becomes narrow as it extends from said back side surface to said spiral passageway.

44. Electronic component packaging means as defined in claim 43, wherein said second slope has an air-guide fin formed thereon in a manner to obliquely extend from said first opening toward said first slope.

45. Electronic component packaging means as defined in claim 43, wherein said through-hole has a plate-like piece fixedly fitted therein, said plate-like piece including a slope, said plate-like piece being fitted in said through-hole in a manner that said slope thereof is opposed to said first slope of said through-hole, whereby a slit is provided between said slope of said plate-like piece and said first slope of said through-hole.

46. Electronic component packaging means as defined in claim 45, wherein each of said slope of said plate-like piece and said first slope of said through-hole is curved, whereby said slit is curved.

47. Electronic component packaging means as defined in claim 43, wherein said casing body has an auxiliary air-intake formed at an initial end portion of said linear passageway to communicate between said linear passageway and the exterior of said casing body, said auxiliary air-intake taking the form of a through-hole, said auxiliary air-intake including a third surface constituting a rear surface relative to the electronic component forwarding direction, a fourth surface constituting a front surface relative to the electronic component forwarding direction, a third opening near said linear passageway, and a fourth opening near the back side surface of said casing body, said third surface constituting a third slope obliquely ascending from said back side surface of said casing body toward the electronic component forwarding direction, said fourth surface constituting a fourth slope steeper than said third slope or being at right angles to the horizontal plane of said casing body, said third opening having a size smaller than that of each of said electronic components, said fourth opening being relatively large, whereby said through-hole of said auxiliary air-intake becomes narrow as it extends from said back side surface to said linear passageway.

48. Electronic component packaging means as defined in claim 47, wherein said second slope has an air-guide fin formed thereon in a manner to obliquely extend from said first opening toward said first slope, and wherein said fourth slope has an air-guide fin formed thereon in a manner to obliquely extend from said third opening toward said third slope.

49. Electronic component packaging means as defined in claim 47, wherein said through-hole of said main air-intake has a first plate-like piece fixedly fitted therein, said first plate-like piece including a slope, said first plate-like being fitted in said through-hole of said main air-intake in a manner that said slope thereof is opposed to said first slope of said through-hole of said main air-intake, whereby a first slit is provided between said slope of said first plate-like piece and said first slope of said through-hole of said main air-intake, and wherein said through-hole of said auxiliary air-intake has a second plate-like piece fixedly fitted therein, said second plate-like piece including a slope, said second plate-like piece being fitted in said through-hole of said auxiliary air-intake in a manner that said slope thereof is opposed to said third slope of said through-hole of said auxiliary air-intake, whereby a second slit is provided between said slope of said plate-like piece and said third slope of said through-hole of said auxiliary air-intake.

50. Electronic component packaging means as defined in claim 49, wherein each of said slope of said first plate-like piece and said first slope of said through-hole of said main air-intake is curved, whereby said first slit is curved, and wherein each of said slope of said plate-like piece and said third slope of said through-hole of said auxiliary air-intake is curved, whereby said second slit is curved.

51. Electronic component packaging means as defined in claim 1, wherein each of said main air-intakes takes the form of a through-hole, said through-hole including a first surface constituting a rear surface relative to the electronic component forwarding direction, a second surface constituting a front surface relative to the electronic component forwarding direction, a first opening near said spiral passageway, and a second opening near a back side surface of said casing body, said first and second surfaces obliquely extending in the electronic component forwarding direction, said first surface constituting a first slope having an angle of about 30° to a horizontal plane of said casing body, said second surface constituting a second slope having an angle of about 30° to the horizontal plane of said casing body, an end of said first slope which is near said first opening being aligned with an end of said second slope which is near said second opening, on a vertical line to the horizontal plane of said casing body.

52. Electronic component packaging means as defined in claim 51, wherein said casing body has an auxiliary air-intake formed at an initial end portion of said linear passageway to communicate between said linear passageway and the exterior of said casing body, said auxiliary air-intake taking the form of a through-hole, said through-hole of said auxiliary air-intake including a third surface constituting a rear surface relative to the electronic component forwarding direction, a fourth surface constituting a front surface relative to the electronic component forwarding direction, a third opening near said linear passageway, and a fourth opening near the back side surface of said casing body, said third and fourth surfaces obliquely extending in the electronic component forwarding direction, said third surface constituting a third slope having an angle of about 30° to the horizontal plane of said casing body, said fourth surface constituting a fourth slope having an angle of about 30° to the horizontal plane of said casing body, an end of said third slope which is near said third opening being aligned with an end of said fourth slope, which is near said fourth opening, on a vertical line to the horizontal plane of said casing body.

53. Electronic component packaging means as defined in any preceding claim, wherein said casing body comprises through-hole means for facilitating detecting of said electronic components contained in said casing body.

54. Electronic component packaging means as defined in claim 53, wherein said through-hole means for facilitating detecting of said electronic components includes a through-hole.

55. Electronic component packaging means as defined in claim 54, wherein said through-hole of said through-hole means is formed in said casing body in a manner to traverse a portion of said linear passageway which is spaced at a predetermined distance away from said outlet, said predetermined distance substantially corresponding to the total length of a few electronic components.

56. Electronic component packaging means as defined in claim 1 wherein said casing body has air-outtakes formed therein, said air-outtakes communicating between predetermined portions of said passageway and the exterior of said casing body.

57. An electronic component supply mechanism for supplying electronic components to a mounting head of an automatic electronic component mounting apparatus by using electronic component packaging means,
said electronic component packaging means comprising:
a substantially plate-like casing body having a substantially spiral passageway formed in its interior, a linear passageway formed therein as a continuation of an outermost circular portion of said spiral passageway, and an outlet formed therein as a continuation of said linear passageway to communicate with the exterior of said body;
a plurality of electronic components received in a row in said spiral passageway of said casing body; and means for facilitating forwarding of said electronic components along said spiral passageway to said outle;

said means for facilitating forwarding of said electronic components comprising a plurality of air-intakes, said air-intakes being formed in said casing body in a manner to communicate between respective circular portions of said spiral passageway and the exterior of said casing body;

said electronic component supply mechanism comprising:

a base for supporting said electronic component packaging means thereon in a manner to cause said plate-like casing body to stand thereon; and air supply means for supplying air into said spiral passageway through said main air-intakes to cause said electronic components to be moved along said spiral passageway toward said outlet;

said outlet and said linear passageway being formed at a portion of said plate-like casing body which is located at an upper position when said packaging means is supported on said base, said outlet being faced upward, above which outlet said mounting head is adapted to wait.

58. An electronic component supply mechanism as defined in claim 57, further including positioning means for positioning said electronic component packaging means with respect to said base.

59. An electronic component supply mechanism as defined in claim 58, wherein said positioning means includes a positioning pin, and wherein said plate-like casing body has a receiving recess formed at its central portion for receiving said positioning pin.

60. An electronic component supply mechanism as defined in claim 57, 58 or 59, wherein said electronic component packaging means further includes shutter means for opening and closing said outlet.

61. An electronic component supply mechanism as defined in claim 60, wherein said plate-like casing body has an elongate recess disposed on an upper wall of a predetermined portion of said linear passageway of said casing body standing on said base, and a vertical through-hole formed at an upper wall of said elongate recess to communicate between said elongate recess and the exterior of said casing body, wherein said base has a support frame provided thereon for supporting said electronic component packaging means, and wherein said shutter means includes an elongate body taking the form of a leaf spring, said shutter body having a first piece extending downward from one end thereof, a second piece extending downward from the other end thereof, and a projection projecting upward from a substantially middle portion thereof, said shutter body being received in said elongate recess of said casing body with said first piece thereof being inserted at its tip end in said outlet, with said projection thereof projecting upward from said casing body through said vertical through-hole of said casing body, and with said second piece being in contact with an upper wall of said linear passageway, said shutter body being supported at its central portion to cais casing body through a support pin, said support frame comprising a substantially square-shaped body standing on said base, said frame body comprising an upper section, a lower section, a right section and a left section, said upper section having a linear groove formed therein for receiving an upper side of said casing body when said packaging means supported by said support frame, said lower section having linear groove formed therein for receiving a lower side of said casing body when said packaging means is supported by said support frame, said linear groove of said upper section having a top surface, said top surface comprising a first portion having a height enough to receive said projection of said shutter body, a slope portion for causing said projection of said shutter body to be gradually pressed down, and a second portion having a height for causing said projection of said shutter body to be fully pressed down, said first, slope and second portions of said linear groove of said upper section in tunrn being disposed along a packaging means supplying direction with respect to said support frame.

62. An electronic component supply mechanism as defined in claim 57, wherein said electronic component supply mechanism further detecting means for detecting said electronic components contained in said casing body, controlling means electrically connected to said detecting means and auto-changer means for automatically replacing said packaging means, said auto-changer means being electrically connected to said controlling means, and wherein said casing body has through-hole means for facilitating detecting of said electronic components, said through-hole means comprising a through-hole formed in said casing body in a manner to traverse a portion of said linear passageway which is spaced at a predetermined distance away from said outlet, said predetermined distance substantially corresponding to the total length of a few electronic components, said detecting means comprising light-emitting means and light-receiving means, said light-emitting and light-receiving means being arranged in a manner to interpose therebetween said packaging means standing on said base of said electronic component supply mechanism and in a manner to be aligned with said through-hole.

63. An electronic component supply mechanism as defined in claim 57, wherein said electronic component supply mechanism includes a branched pipe mechanically connected to said air supply means, detecting means for detecting said electronic components contained in said casing body, and congrolling means electrically connected to said detecting means, said branched pipe including a first pipe portion and a second pipe portion, said first pipe portion being provided with a first switching valve for closing and opening said first pipe portion, said second pipe portion being provided with a second switching valve for closing and opening said second pipe portion, said detecting means comprising light-emitting means and light-receiving means, and wherein said casing body has a through-hole for facilitating detecting of said electronic components and an auxiliary air-intakes, said through-hole being formed in said casing body in a manner to traverse a portion of said linear passageway which is sapced at a predetermined distance away from said outelt, said predetermined distance substantially corresponding to the total length of a few electronic components, said auxiliary air-intake being formed at an initial end portion of said linear passageway to communicate between said linear passageway and the exterior of said casing body, said first pipe portion of said branched pipe and said second pipe portion of said branched pipe being adapted to be connected to said main air-intakes and said auxiliary air-intake, respectively, when said packaging means is supported on said base, said light-emitting means and said light-receiving means being arranged in a manner to interpose therebetween said packaging means standing on said base and in a manner to be aligned with said through-hole, said first and second switching valves being electrically connected to said controlling means, said light-receiving means being adapted to send a signal to said controlling means while said light-receiving means receive light from said light-emitting means, said controlling means being adapted to send signals to said first and second switching valves while said controlling means receives the signal from said light-receiving means, said first switching valve being adapted to open said first pipe portion of said branched pipe and said second switching valve being adapted to close said second pipe portion of said branched pipe while said first and second switching valves receive the signals from said controlling means, said first switching valve being adapted to automatically close said first pipe portion of said branched pipe portion and said second switching valve being adapted to automatically open said second pipe portion of said branched pipe when the sending of the signals from said controlling means to said first and second switching valves is stopped.

64. A method of supplying electronic components to a mounting head, comprising the steps of:
preparing electronic component packaging means, said electronic component packaging means comprising a substantially plate-like casing body having a substantially spiral passageway formed in its interior, a linear passageway formed therein as a continuation of an outermost circular portion of said spiral passageway, an outlet formed therein as a continuation of said linear passageway to communicate with the exterior of said body, a plurality of electronic components received in a row in said spiral passageway of said casing body, and means for facilitating forwarding of said electronic components along said spiral passageway to said outlet, said means for facilitating forwarding of said electronic components comprising a plurality of main air-intakes and an auxiliary air-intake, said main air-intakes being formed in said casing body in a manner to communicate between respective circular portions of said spiral passageway and the exterior of said casing body, said packaging means being adapted to be supported on a base of an electronic component supply mechanism with said plate-like casing body standing on said base, said outlet and said linear passageway being formed at a portion of said plate-like casing body which is located at an upper position when said packaging means is supported on said base, said outlet being faced upward, above which outlet said mounting head is adapted to wait;
supplying air into said spiral passageway through said main air-intakes to forward said electronic components toward said linear passageway along said spiral passageway;
detecting electronic components arriving at said linear passageway due to the supplying of air into said spiral passageway through said main air-intakes;
supplying air into said linear passageway through said auxiliary air-intake to forward electronic components, arriving at said linear passageway due to the supplying of air into said spiral passageway through said main air-intakes, toward said outlet;
taking said electronic components, arriving at said outlet, one by one by said mounting head.

* * * * *